(12) United States Patent
Kondo

(10) Patent No.: US 10,998,060 B2
(45) Date of Patent: *May 4, 2021

(54) MEMORY SYSTEM IN WHICH CONTROLLER ACQUIRES STATUS OF NONVOLATILE MEMORY AND CONTROL METHOD THEREOF

(71) Applicant: Toshiba Memory Corporation, Minato-ku (JP)

(72) Inventor: Takashi Kondo, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/594,260

(22) Filed: Oct. 7, 2019

(65) Prior Publication Data

US 2020/0035308 A1 Jan. 30, 2020

Related U.S. Application Data

(63) Continuation of application No. 15/902,031, filed on Feb. 22, 2018, now Pat. No. 10,490,290.

(30) Foreign Application Priority Data

Sep. 13, 2017 (JP) .............................. JP2017-175911

(51) Int. Cl.
| | |
|---|---|
| G11C 16/06 | (2006.01) |
| G11C 16/32 | (2006.01) |
| G11C 16/34 | (2006.01) |
| G11C 16/08 | (2006.01) |
| G11C 16/10 | (2006.01) |

(Continued)

(52) U.S. Cl.
CPC .............. *G11C 16/32* (2013.01); *G06F 13/00* (2013.01); *G06F 13/1689* (2013.01); *G11C 16/08* (2013.01); *G11C 16/10* (2013.01); *G11C 16/14* (2013.01); *G11C 16/26* (2013.01); *G11C 16/3445* (2013.01); *G11C 16/0483* (2013.01)

(58) Field of Classification Search
CPC ...... G11C 16/32; G11C 16/14; G11C 16/3445; G11C 16/08; G11C 16/10; G11C 16/26; G11C 16/0483; G06F 13/1689; G06F 13/00
USPC .................................................... 365/185.22
See application file for complete search history.

(56) References Cited

U.S. PATENT DOCUMENTS

| 9,443,599 B2 * | 9/2016 | Yi | ........................... G11C 16/16 |
| 10,490,290 B2 * | 11/2019 | Kondo | ................... G11C 16/32 |

(Continued)

FOREIGN PATENT DOCUMENTS

JP 2004-227635 8/2004

*Primary Examiner* — Tha-O H Bui
(74) *Attorney, Agent, or Firm* — Oblon, McClelland, Maier & Neustadt, L.L.P.

(57) ABSTRACT

According to an embodiment, a memory system including: a semiconductor memory configured to store data, a memory controller configured to issue a first command to suspend a first operation to the semiconductor memory which is executing the first operation, wherein the memory controller is configured to prohibit the issuance of the first command until a time in which the first operation is executed passes a first threshold, acquire a status of the semiconductor memory which is executing the first operation, and update the first threshold to a second threshold in accordance with the status.

20 Claims, 17 Drawing Sheets

(51) Int. Cl.
*G11C 16/26* (2006.01)
*G06F 13/16* (2006.01)
*G06F 13/00* (2006.01)
*G11C 16/14* (2006.01)
*G11C 16/04* (2006.01)

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2012/0179860 A1 | 7/2012 | Falanga |
| 2013/0128675 A1 | 5/2013 | Kim |
| 2016/0012891 A1 | 1/2016 | Intrater et al. |

* cited by examiner

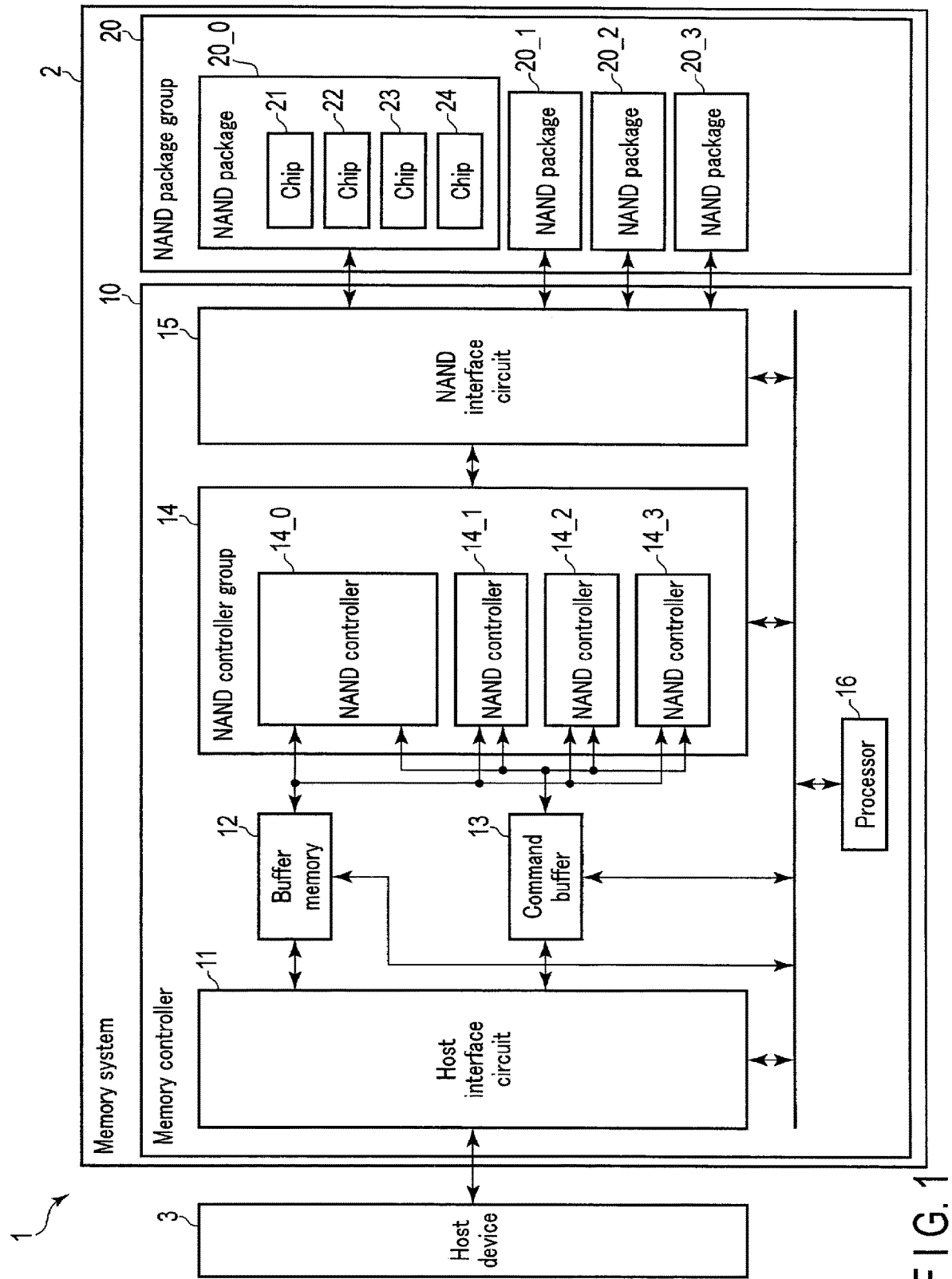
F I G. 1

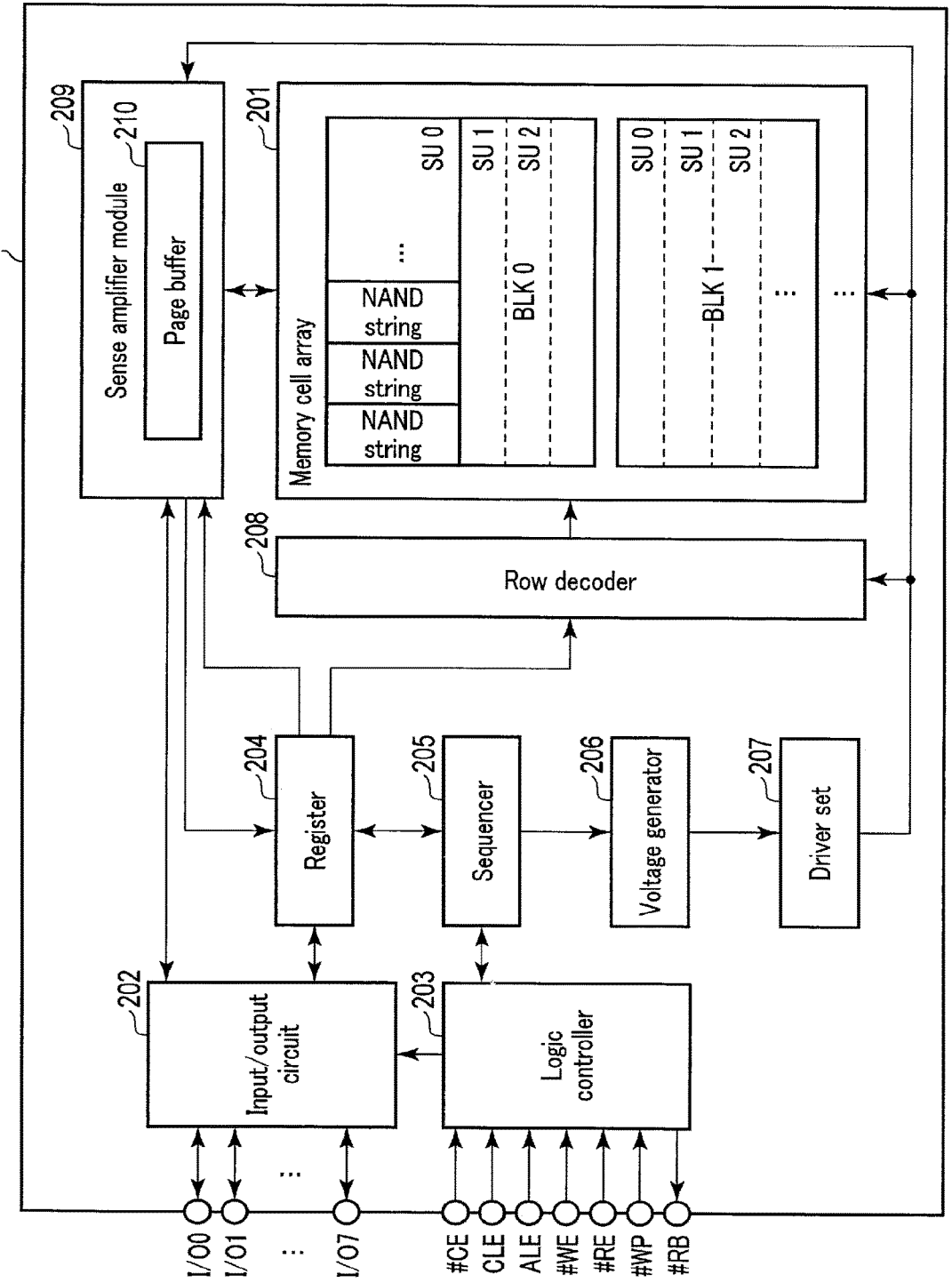
F I G. 3

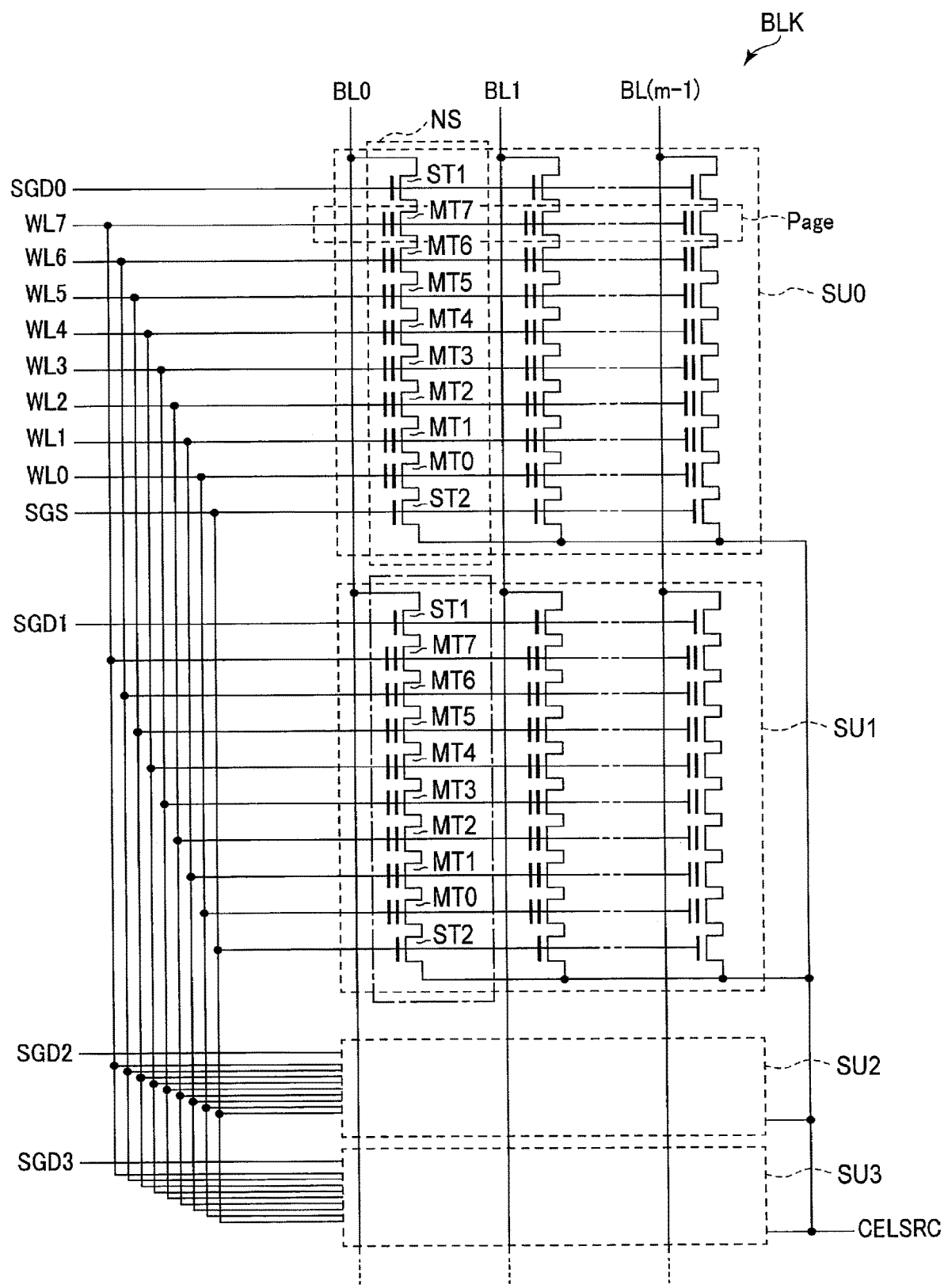
F I G. 4

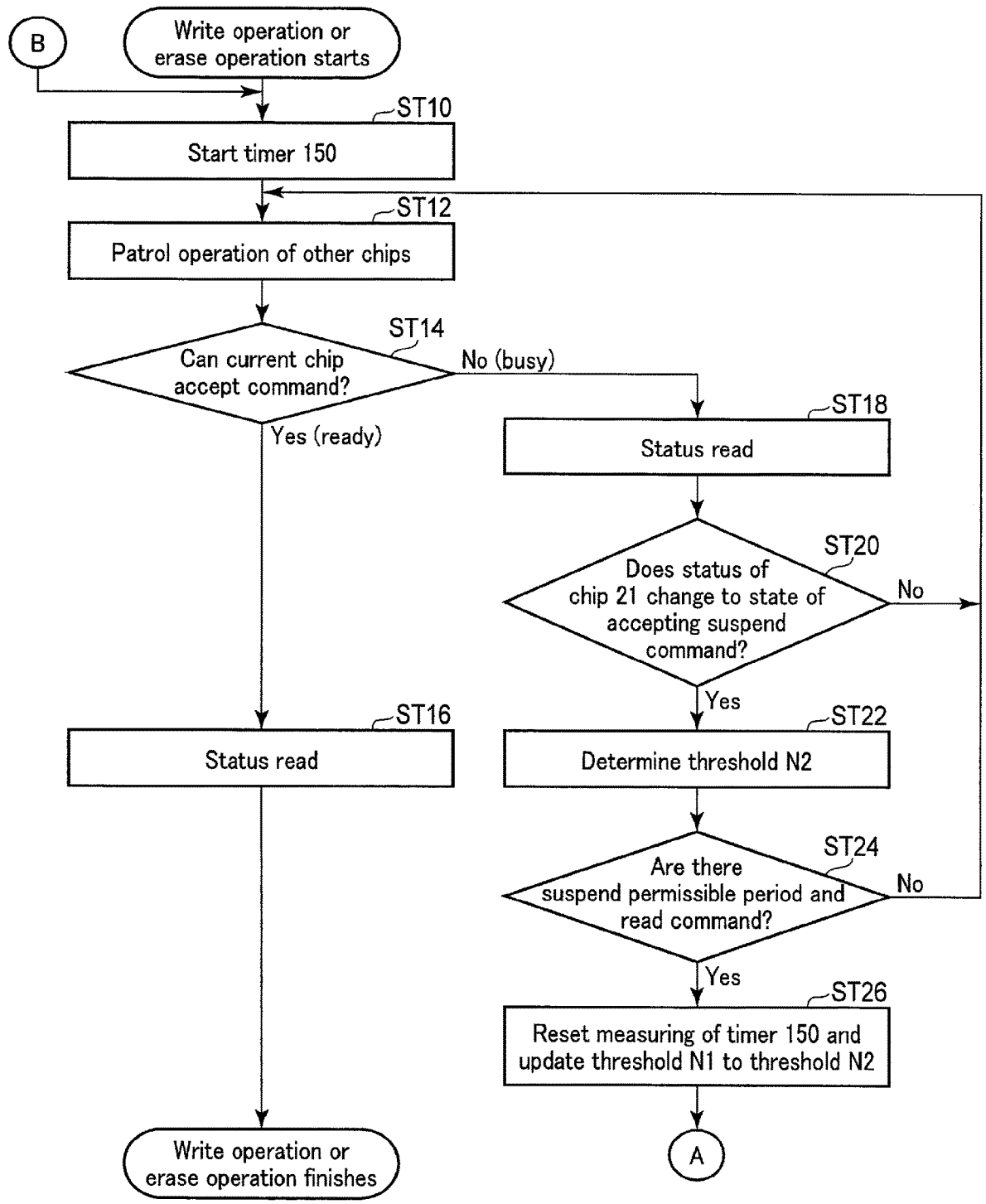
F I G. 7

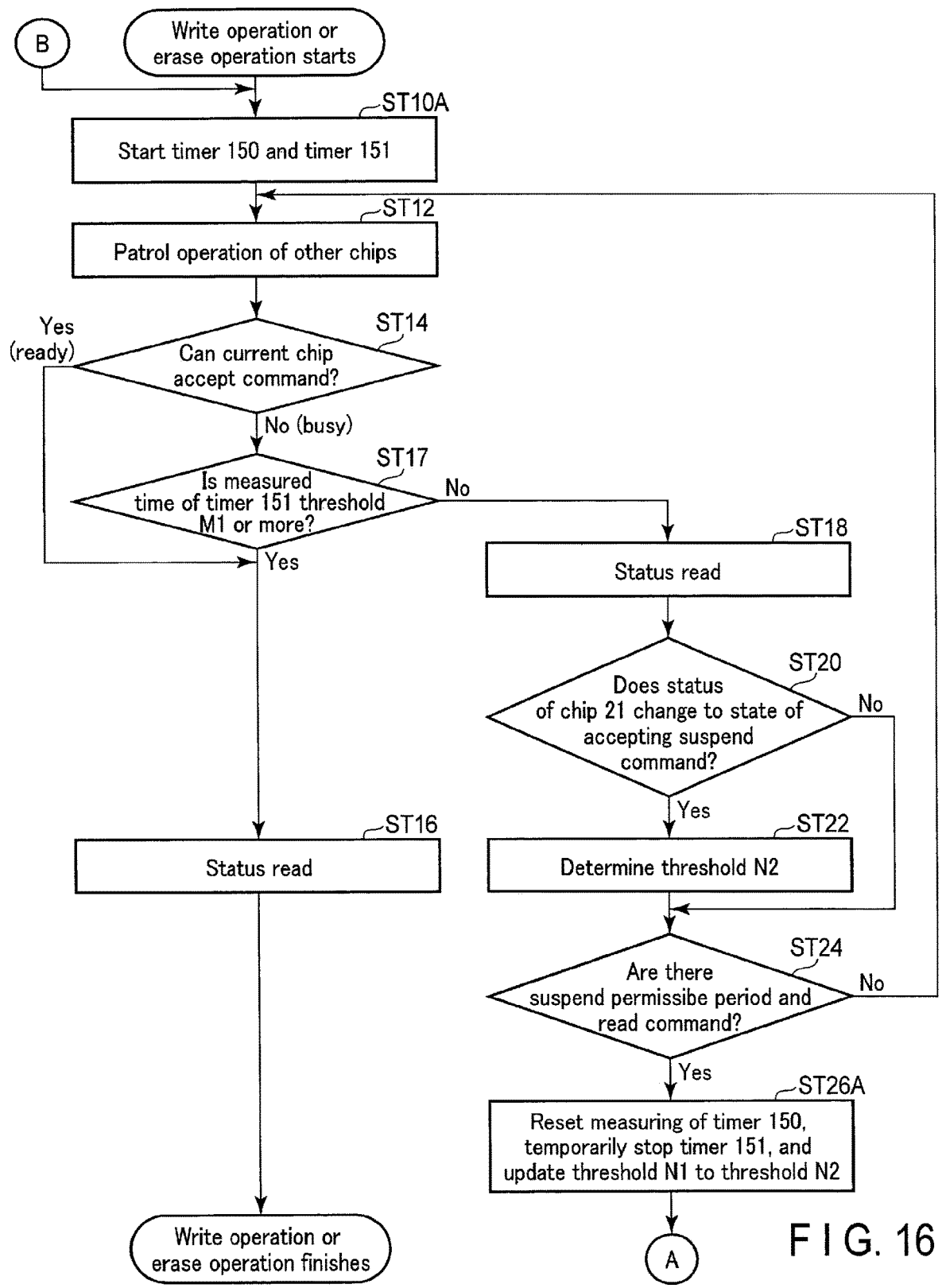
F I G. 16

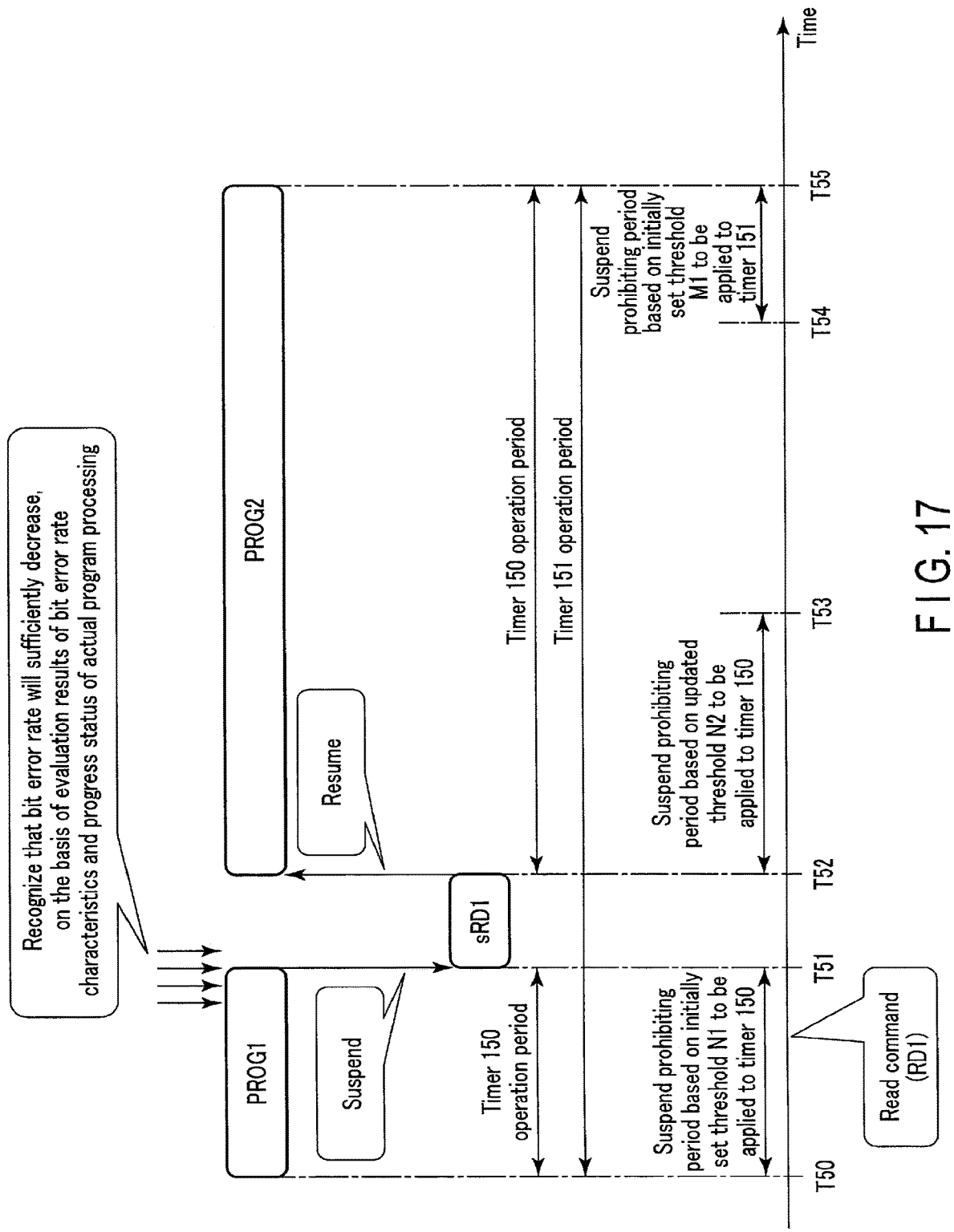
F I G. 17

MEMORY SYSTEM IN WHICH CONTROLLER ACQUIRES STATUS OF NONVOLATILE MEMORY AND CONTROL METHOD THEREOF

CROSS-REFERENCE TO RELATED APPLICATIONS

This application is a continuation of and claims the benefit of priority under 35 U.S.C. § 120 from U.S. application Ser. No. 15/902,031 filed Feb. 22, 2018 (now U.S. Pat. No. 10,490,290 issued Nov. 26, 2019), and claims the benefit of priority under 35 U.S.C. § 119 from Japanese Patent Application No. 2017-175911 filed Sep. 13, 2017, the entire contents of each of which are incorporated herein by reference.

FIELD

Embodiments described herein relate generally to a memory system.

BACKGROUND

A memory system implementing a NAND flash memory serving as a semiconductor storage device, and a controller controlling the NAND flash memory is known.

BRIEF DESCRIPTION OF THE DRAWINGS

FIG. 1 is a block diagram to explain a configuration of an information processing system including a memory system according to a first embodiment;

FIG. 3 is a sectional view to explain a chip configuration of the memory system according to the first embodiment;

FIG. 4 is a circuit diagram to explain a configuration of a memory cell array of the chip in the memory system according to the first embodiment;

FIG. 7 is a flow chart to explain the suspend operation in the memory system according to the first embodiment;

FIG. 16 is a flow chart to explain a suspend operation in the memory system according to the fourth embodiment; and FIG. 17 is a schematic diagram to explain a write operation accompanied by the suspend operation in the memory system according to the fourth embodiment.

DETAILED DESCRIPTION

Figure 2:
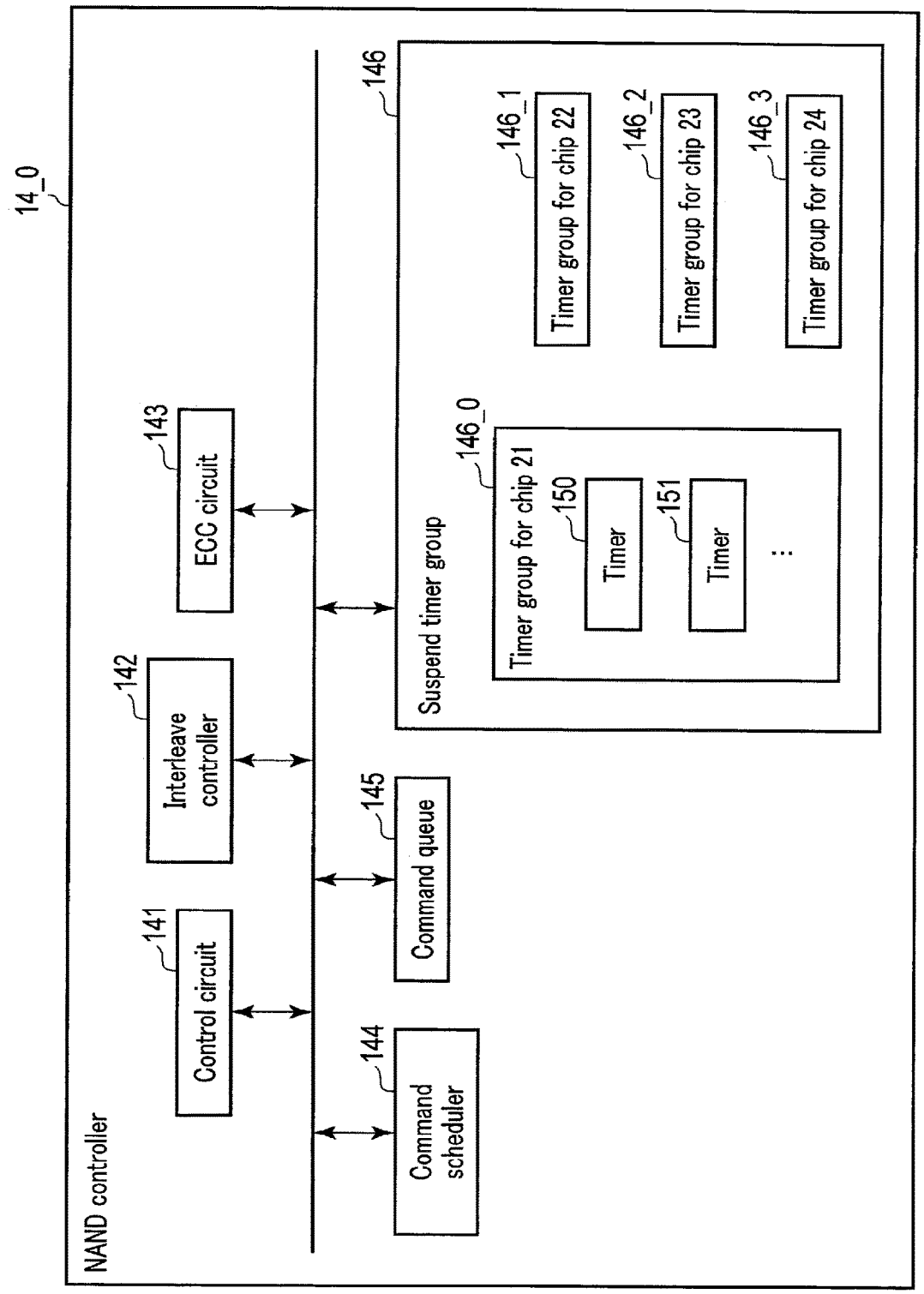
FIG. 2 is a block diagram to explain a configuration of a NAND controller of the memory system according to the first embodiment.

In general, according to one embodiment, a memory system includes: a semiconductor memory configured to store data, a memory controller configured to issue a first command to suspend a first operation to the semiconductor memory which is executing the first operation, wherein the memory controller is configured to prohibit the issuance of the first command until a time in which the first operation is executed passes a first threshold, acquire a status of the semiconductor memory which is executing the first operation, and update the first threshold to a second threshold in accordance with the status.

Hereinafter, embodiments will be described with reference to the drawings. In the following description, common reference numerals denote components having the same functions and configurations.

1. First Embodiment

A memory system according to a first embodiment will be described. The memory system according to the first embodiment is, for example, a system comprising NAND-type flash memories, and a memory controller which controls the NAND-type flash memories.

1.1 Configuration

A configuration of the memory system according to the first embodiment will be described.

1.1.1 Configuration of Information Processing System

The configuration of the information processing system including the memory system according to the first embodiment is initially described with reference to FIG. 1.

As shown in FIG. 1, an information processing system 1 includes a memory system 2 and a host device 3. For example, the memory system 2 stores data received from the host device 3, and reads out the data to the host device 3.

The memory system 2 includes a memory controller 10 and a NAND package group 20.

The NAND package group 20 includes NAND packages such as four NAND packages 20_0 to 20_3 as in FIG. 1. It should be noted that the number of the NAND packages included in the NAND package group 20 is not limited to four, and any number is applicable.

The NAND package 20_0 contains several chips, for example, four chips 21 to 24 as in FIG. 1. Each of the chips may include a NAND-type flash memory. It should be noted that the number of the chips contained in the NAND package 20_0 is not limited to four, and any number is applicable. Such a configuration also applies to the other NAND packages 20_1 to 20_3. Configurations of the respective chips contained in the NAND package 20_0 will be described later.

1.1.2 Configuration of Memory Controller

A configuration of the memory controller of the memory system according to the first embodiment will be described with reference to FIG. 1.

The memory controller 10 is, for example, a system on a chip (SoC), and receives a command from the host device 3, and controls the NAND package group 20 in accordance with the received command. Specifically, when the host device 3 instructs the memory controller 10 to write data, the memory controller writes the data into the NAND package group 20, and when the host device 3 instructs the memory controller to read the data, the memory controller reads the data from the NAND package group 20 to transmit the data to the host device 3.

The memory controller 10 includes a host interface circuit 11, a buffer memory 12, a command buffer 13, a NAND controller group 14, a NAND interface circuit 15, and a processor (e.g., CPU: central processing unit) 16. It should be noted that function of each of the components 11 to 16 included in the memory controller 10 described as follows can be realized by hardware, or a combination of hardware and firmware.

The host interface circuit 11 is connected to the host device 3, and manages communication with the host device 3. For example, data and commands received from the host device 3 are transferred to the buffer memory 12 and the command buffer 13 respectively by the host interface circuit 11.

The buffer memory 12 stores, for example, the data to be written into the NAND package group 20 or the data read from the NAND package group 20.

The command buffer 13 mainly controls data communication between the buffer memory 12 and the NAND controller group 14 in accordance with the command received via the host interface circuit 11. Furthermore, the command buffer 13 transmits the command received from the host device 3 to the NAND controller group 14.

The NAND controller group 14 generates a command, an address and the like to be transmitted and received between the NAND controller group 14 and the NAND package group 20 on the basis of the data from the buffer memory 12 and the command from the command buffer 13. For example, the NAND controller group 14 issues a read command that conforms to a NAND interface specification to the NAND package group 20, in accordance with a data read command received from the host device 3. This operation similarly applies to the case of writing or erasing.

The NAND controller group 14 includes NAND controllers such as four NAND controllers 14_0 to 14_3 as in FIG. 1. The NAND controllers 14_0 to 14_3 contained in the NAND controller group 14 correspond to the NAND packages 20_0 to 20_3 included in the NAND package group 20, respectively.

That is, the NAND controllers 14_0 to 14_3 communicate with the NAND packages 20_0 to 20_3, respectively. Configurations of the respective NAND controllers contained in the NAND controller group 14 will be described later.

The NAND interface circuit 15 is connected to the NAND package group 20, and manages communication with the NAND package group 20. The NAND interface circuit 15 transmits the commands, addresses, write data and the like sent out from the NAND controllers 14_0 to 14_3 to the corresponding NAND packages 20_0 to 20_3, in accordance with an instruction of the processor 16. Furthermore, the NAND interface circuit 15 receives the data read from the NAND packages 20_0 to 20_3, and transfers the data to the corresponding NAND controllers 14_0 to 14_3.

The processor 16 controls an operation of the whole memory controller 10.

1.1.3 Configuration of NAND Controller

Next, the configuration of each NAND controller of the memory system according to the first embodiment will be described.

FIG. 2 is a block diagram to explain an example of the configuration of the NAND controller of the memory system according to the first embodiment. FIG. 2 shows the configuration of the NAND controller 14_0 among the NAND controllers, and this configuration similarly applies to the configurations of the other NAND controllers 14_1 to 14_3.

As shown in FIG. 2, the NAND controller 14_0 includes a control circuit 141, an interleave controller 142, an error check and correction (ECC) circuit 143, a command scheduler 144, a command queue 145, and a suspend timer group 146. As described above, the NAND controller 14_0 corresponds to the NAND package 20_0.

The control circuit 141 controls an operation of the whole NAND controller 14_0. For example, the control circuit 141 generates a command set including one or more commands on the basis of the command received from the command buffer 13. The generated command set is stored in, for example, the command queue 145.

The interleave controller 142 controls an order, a timing and the like of the communication between the NAND controller 14_0 and the chips 21 to 24 contained in the NAND package 20_0.

The ECC circuit 143 performs error detection and error correction processing. More specifically, during writing of the data, an ECC code is generated for each of a certain number of data sets on the basis of the data received from the host device 3. Furthermore, during reading of the data, the ECC code is decoded, and presence/absence of an error is detected. Then, when the error is detected, its bit position is specified, and the error is corrected.

The command scheduler 144 determines an order of the command sets to be issued from the command queue 145 to the NAND package 20_0. The order of the command sets may be an order of the store of the command sets, but is not limited thereto. For example, the command scheduler 144 can determine the order of the commands so that some parts or all of the command sets are issued before other parts or all of the previously stored command sets are issued.

On receiving the command set from the control circuit 141, the command queue 145 temporarily stores the command set. Furthermore, the command queue 145 issues the stored command sets to the NAND package 20_0 in accordance with the order determined by the command scheduler 144.

The suspend timer group 146 includes timers used in generating a suspend command. The suspend command is a command to temporarily stop a certain operation which is being executed by each of the chips 21 to 24.

Specifically, the suspend timer group 146 includes timer groups such as a timer group 146_0 for the chip 21, a timer group 146_1 for the chip 22, a timer group 146_2 for the chip 23, and a timer group 146_3 for the chip 24 which correspond to the chips 21 to 24, respectively. It should be noted that the timer groups 146_0 to 146_3 have similar configurations, and hence, an example of a configuration of the timer group 146_0 for the chip 21 will only be described.

The timer group 146_0 for the chip 21 contains at least one timer such as a timer 150, a timer 151 . . . as in the example of FIG. 2. For example, each timer starts measuring or resets its measured time in accordance with an instruction from the control circuit 141.

1.1.4 Configuration of Chip

Next, a configuration of each chip of the memory system according to the first embodiment will be described.

FIG. 3 is a block diagram to explain an example of the chip configuration of the memory system according to the first embodiment. FIG. 3 shows the configuration of the chip 21 among the chips, and this configuration also applies to the other chips 22 to 24.

As shown in FIG. 3, the chip 21 includes a memory cell array 201, an input/output circuit 202, a logic controller 203, a register 204, a sequencer 205, a voltage generator 206, a driver set 207, a row decoder 208, and a sense amplifier module 209.

The memory cell array 201 includes blocks BLKs (BLK0, BLK1 . . . ). The block BLK includes nonvolatile memory cell transistors (not shown) associated with word lines and bit lines. The block BLK is, for example, a unit for data erase, that is, the data in the same block BLK is collectively erased. Each block BLK includes string units SUs (SU0, SU1, SU2, Each string unit SU is a set of NAND strings NSs. Each NAND string NS contains memory cell transistors. It should be noted that the number of the blocks in the memory cell array 201, the number of the string units in one block BLK and the number of the NAND strings in one string unit SU can be set to any numbers.

The input/output circuit 202 transmits signals I/O<7:0> (from I/O0 to I/O7) to the memory controller 10 and receives the signals from the memory controller 10. The signal I/O<7:0> is, for example, an 8-bit signal. The signal I/O<7:0> is an entity of the data to be transmitted/received between the chip 21 and the NAND controller 14_0, and includes a command, an address and data (write data and read data). The input/output circuit 202 transfers the command and address of the signal I/O to the register 204. The input/output circuit 202 transmits the write data and the read data to the sense amplifier module 209 and receives the data from the sense amplifier module.

The logic controller 203 receives signals #CE, CLE, ALE, #WE, #RE, and #WP from the NAND controller 14_0. Furthermore, the logic controller 203 transfers a signal #RB to the NAND controller 14_0 to notify a status of the chip 21. It should be noted that in the following description, when "#" is attached to a top of a name of the signal, it is indicated that the signal is a low active signal.

The signal #CE is a signal to enable the chip 21. The signal CLE notifies the chip 21 that the signal I/O<7:0> to be input into the chip 21 while the signal CLE is at an "H (high)"-level is a command. The signal ALE notifies the chip 21 that the signal I/O<7:0> to be input into the chip 21 while the signal ALE is at the "H"-level is an address. The signal #WE instructs the chip 21 to take therein the signal I/O<7:0> to be input into the chip 21 while the signal #WE is at a "L (low)"-level. The signal #RE instructs the chip 21 to output the signal I/O<7:0>. The signal #WP instructs the chip 21 to prohibit data writing and erasing. The signal #RB indicates that the chip 21 is in a ready state (i.e., a state in which the command from the NAND controller 14_0 is basically accepted) or a busy state (i.e., a state in which the command from the NAND controller 14_0 is basically not accepted). It should be noted that the chip 21 can accept parts of commands, e.g., a status read command, a suspend command, and the like, which will be described later, even in its busy state.

The register 204 stores the command and the address. The register 204 transfers the address to the row decoder 208 and the sense amplifier module 209, and transfers the command to the sequencer 205.

The sequencer 205 receives the command, and controls the whole chip 21 in accordance with a sequence based on the received command.

The voltage generator 206 generates a voltage required to execute a data write operation, a data read operation, a data erase operation or the like in accordance with an instruction from the sequencer 205. The voltage generator 206 supplies the generated voltage to the driver set 207.

The driver set 207 includes drivers, and supplies various voltages supplied from the voltage generator 206 to the row decoder 208 and the sense amplifier module 209 on the basis of the address from the register 204. The driver set 207 supplies various voltages to the row decoder 208 on the basis of, for example, a row address among the addresses.

The row decoder 208 receives the row address among the addresses from the register 204, and selects the block BLK on the basis of the row address. Then, the voltage supplied from the driver set 207 is applied to the selected block BLK via the row decoder 208.

During the data reading, the sense amplifier module 209 senses the read data read from the memory cell transistor out to the bit line, and transfers the sensed read data to the input/output circuit 202. Furthermore, the sense amplifier module 209 contains, for example, a page buffer 210 configured to temporarily store the read data, and the sensed read data may be cached in the page buffer 210. During the data writing, the sense amplifier module 209 transfers the write data to be written via the bit line to the memory cell transistor. Furthermore, the sense amplifier module 209 receives a column address among the addresses from the register 204, and outputs data of a column based on the column address.

1.1.5 Structure of Memory Cell Array

The following explains the structure of the memory cell array of the chip in the memory system according to the first embodiment, with reference to FIG. 4.

As shown in FIG. 4, each of the NAND strings NS includes, for example, eight memory cell transistors MT (MT0 to MT7), a selection transistor ST1, and a selection transistor ST2. The number of memory cell transistors MT is not limited to eight, and may be 16, 32, 64, or 128. The number thereof is not limited. Each of the memory cell transistors MT includes a stacked gate including a control gate and a charge storage layer. The memory cell transistors MT are connected in series between the selection transistors ST1 and ST2. In the following explanation, the term "connect" also includes the case where another conductive element is interposed therebetween (that is, the case where a conductive element is electrically connected with another conductive element).

In a block BLK, gates of the selection transistors ST1 of the string units SU0 to SU3 are connected with selection gate lines SGD0 to SGD3, respectively. In addition, gates of the selection transistors ST2 of all the string units SU in the block BLK are connected in common with a selection gate line SGS. Control gates of the memory cell transistors MT0 to MT7 in the same block BLK are connected with word lines WL0 to WL7, respectively. Specifically, the word lines WL of the same address are connected in common with all the string units SU in the same block BLK, and the selection gate lines SGS are connected in common with all the string units SU in the same block BLK. By contrast, each selected gate line SGD is connected with only one string unit SU in the same block BLK.

Among NAND strings NS arranged in a matrix in the memory cell array 201, the other ends of the selection transistors ST1 of the NAND strings NS in the same column are connected with one of m bit lines BL (BL0 to BL (m−1), where m is a natural number). Each of the bit lines BL is connected in common with NAND strings NS of the same column through a plurality of blocks BLK.

The other ends of the selection transistors ST2 are connected with a source line CELSRC. The source line CELSRC is connected in common with a plurality of NAND strings NS through the blocks BLK.

As described above, data erase is collectively performed on the memory cell transistors MT in the same block BLK. By contrast, data read and data write can be performed on a plurality of memory cell transistors MT connected in common with one of the word lines WL in one string unit SU in one block BLK. Such a unit of memory cell transistors MT on which data write can be performed together may be referred to as a "page".

Figure 5:
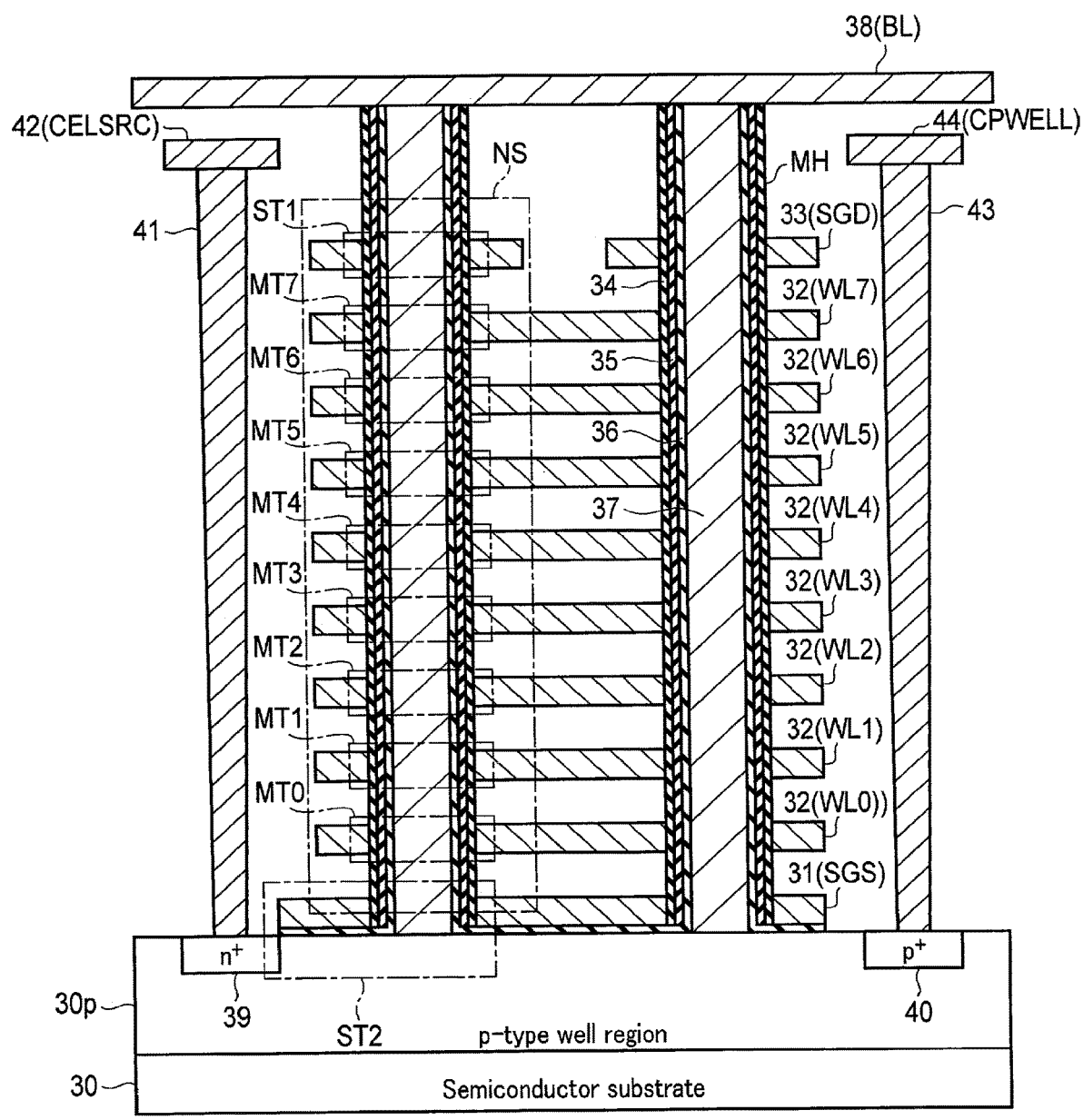
FIG. 5 is a sectional view to explain the configuration of the memory cell array of the chip in the memory system according to the first embodiment.

The following explains of a cross-sectional structure of the memory cell array 201, with reference to FIG. 5. FIG. 5 illustrates an example of a cross-sectional structure of part of the memory cell array of the chip in the memory system according to the first embodiment. In particular, FIG. 5 illustrates two NAND strings NS of two string units SU in one block BLK, and a peripheral part thereof. A plurality of structures of the NAND strings NS shown in FIG. 5 are arranged in the X direction, for example, and a group of NAND strings NS arranged in the X direction corresponds to one string unit SU.

The memory cell array 201 is provided on a semiconductor substrate 30. In the following explanation, a plane parallel with the surface of the semiconductor substrate 30 is referred to as an XY plane, and a direction perpendicular to the XY plane is referred to as Z direction. The X direction and the Y direction are orthogonal to each other.

A p-type well region 30$p$ is provided on an upper portion of the semiconductor substrate 30. A plurality of NAND strings NS are provided on the p-type well region 30$p$. Specifically, for example, a wiring layer 31 functioning as the selection gate line SGS, eight wiring layers 32 (WL0 to WL7) functioning as the word lines WL0 to WL7, and wiring layer 33 functioning as the selection gate line SGD are successively stacked on the p-type well region 30$p$. An insulating film (not shown) is provided between the stacked wiring layers 31 to 33.

The wiring layer 31 is connected in common with gates of the respective selection transistors ST2 of the NAND strings NS in one block BLK. Each of the wiring layers 32 is connected in common with control gates of the respective memory cell transistors MT of the NAND strings NS in one block BLK. The wiring layer 33 is connected in common with gates of the respective selection transistors ST1 of the NAND strings NS in one string unit SU.

Each of memory holes MH is provided to extend through the wiring layers 33, 32, and 31 and reach the p-type well region 30$p$. A block insulating film 34, a charge storage layer (insulating film) 35, and a tunnel oxide film 36 are successively provided on side surfaces of each memory hole MH. Inside of each memory hole MH is filled with a semiconductor pillar (conductive film) 37. The semiconductor pillar 37 is, for example, non-doped polysilicon, and functions as a current path of the NAND string NS. A wiring layer 38 functioning as the bit line BL is provided on an upper ends of the memory holes MH.

As described above, the selection transistor ST2, the memory cell transistors MT, and the selection transistor ST1 are successively stacked above the p-type well region 30$p$, and one memory hole MH corresponds to one NAND string NS.

An $n^+$ type impurity diffusion region 39 and a $p^+$ type impurity diffusion region 40 are provided in an upper portion of the p-type well region 30$p$. A contact plug 41 is provided on an upper surface of the $n^+$ type impurity diffusion region 39. A wiring layer 42 functioning as the source line CELSRC is provided on an upper surface of the contact plug 41. A contact plug 43 is provided on an upper surface of the $p^+$ type impurity diffusion region 40. A wiring layer 44 functioning as a well line CPWELL is provided on an upper surface of the contact plug 43.

The structure of the memory cell array 201 may be different structure. The structure of the memory cell array 201 is disclosed in, for example, "Three-dimensional stacked non-volatile semiconductor memory" being U.S. patent application Ser. No. 12/407,403 filed on Mar. 19, 2009. It is also disclosed in "Three-dimensional stacked non-volatile semiconductor memory" being U.S. patent application Ser. No. 12/406,524 filed on Mar. 18, 2009, "Non-volatile semiconductor storage device and method for manufacturing the same" being U.S. patent application Ser. No. 12/679,991 filed on Mar. 25, 2010, and "Semiconductor memory and method for manufacturing the same" being U.S. patent application Ser. No. 12/532,030 filed on Mar. 23, 2009. The whole of these patent applications are cited by reference in the specification of the present application.

1.2 Operation

Next, an operation of the memory system according to the first embodiment will be described.

Here, an example of the operation to be executed between the NAND controller 14_0 and the NAND package 20_0 in the memory system 2 will be described. The operation is similar to operations to be executed between the other NAND controllers 14_1 to 14_3 and the other NAND packages 20_1 to 20_3.

1.2.1 Outline of Suspend Operation

An outline of a suspend operation of the memory system according to the first embodiment will be described.

The suspend operation is an operation which occurs when any one of the chips 21 to 24 in the NAND package 20_0 is executing a certain operation OP1 (i.e., in the busy state). The NAND controller 14_0 issues the suspend command to the chip in the busy state (e.g., the chip 21), whereby the operation OP1 which is being executed in the chip 21 can temporarily be stopped (i.e., the chip 21 can be brought into the ready state). The NAND controller 14_0 can further issue a new command, whereby a new operation OP2 corresponding to the new command can suspend the operation OP1 and can be executed in the chip 21. The NAND controller 14_0 issues a resume command to the chip 21 after the operation OP2 is completed, whereby the suspended operation OP1 can be resumed. In the following description, "an operation of temporarily stopping the operation OP1 while the operation OP1 is being executed, to execute the operation OP2 first, and resuming the operation OP1 after the operation OP2 is finished" will generically be referred to as "the suspend operation".

Figure 6:
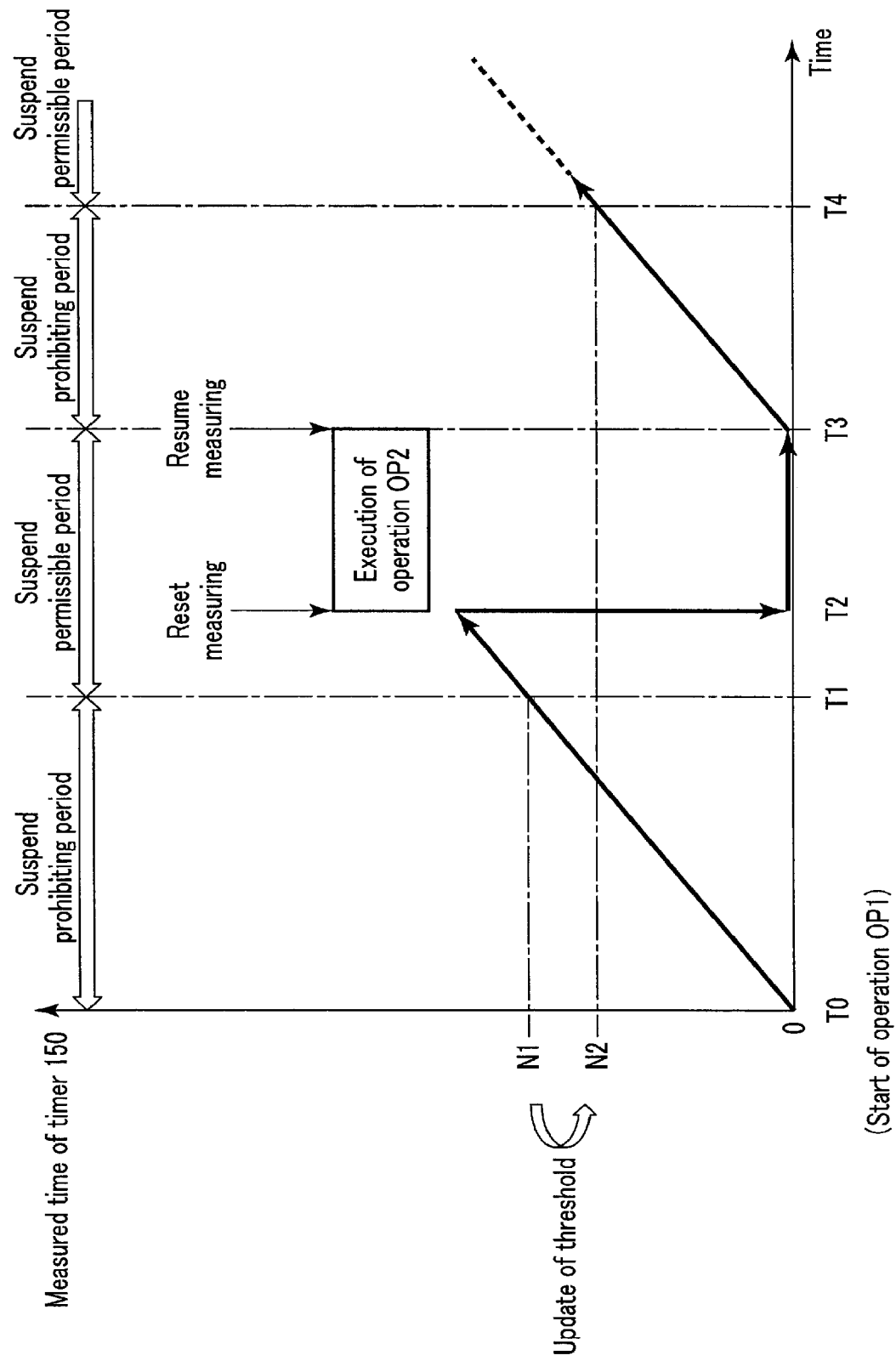
FIG. 6 is a diagram to explain a relation between a suspend operation and a measured time of a timer in the memory system according to the first embodiment.

FIG. 6 is a diagram to explain a relation between the suspend operation and a measured time of the timer in the memory system according to the first embodiment. In FIG. 6, the abscissa indicates time, and the ordinate indicates the measured time of the timer 150. Then, FIG. 6 shows the behavior to permit or prohibit the suspend operation concerning the operation OP2 during the execution of the operation OP1 is changed in accordance with the measured time of the timer 150.

As shown in FIG. 6, at time T0, the chip 21 starts the operation OP1, and the NAND controller 14_0 accordingly starts the timer 150. Any threshold can be associated with the timer 150. For example, the NAND controller 14_0 prohibits the suspend operation when the measured time of the timer 150 is less than the threshold, and permits the suspend operation when the measured time is not less than the threshold. That is, a time zone in which the measured time of the timer 150 is less than the threshold is called a suspend prohibiting period, and a time zone in which the measured time is not less than the threshold is called a suspend permissible period. It should be noted that the threshold is beforehand stored, for example, in a register (not shown in the drawing). FIG. 6 shows an example where a threshold N1 is set at the time T0.

At the time T0, the measured time of the timer 150 is less than the threshold N1. Consequently, the NAND controller 14_0 does not issue the suspend command, even when receiving, from the host device 3, a command to execute the operation OP2. In consequence, the chip 21 continues executing the operation OP1 without stopping the operation.

At time T1, the measured time of the timer 150 reaches the threshold N1. Consequently, the suspend permissible period starts at the time T1, and the NAND controller 14_0 can issue the suspend command when the command to execute the operation OP2 is received from the host device 3. In the example of FIG. 6, the command to execute the operation OP2 is not received from the host device 3 at the time T1, and hence, the chip 21 continuously executes the operation OP1.

On receiving the command to execute the operation OP2 from the host device 3 at time T2, the NAND controller 14_0 and the chip 21 execute the suspend operation. Accordingly, the NAND controller 14_0 resets the measured time of the timer 150 to "0", and updates a value of the threshold to be associated with the timer 150 from the threshold N1 to a threshold N2. FIG. 6 shows the example where a value smaller than the threshold N1 is set to the threshold N2. In the first embodiment, it is described that the value smaller than the threshold N1 is set to the threshold N2, but the present invention is not limited to this embodiment, and a value larger than the threshold N1 may be set to the threshold N2.

It should be noted that at the time T2, the measured time of the timer 150 is reset, thereby the measuring is stopped. The threshold N2 may beforehand be stored, for example, in a register (not shown in the drawing), or may be determined by the NAND controller 14_0 on the basis of an execution status of the chip 21 until the time T2 is reached.

When the suspend operation finishes (i.e., the operation OP2 finishes and the operation OP1 resumes) at time T3, the NAND controller 14_0 resumes the timer 150. At the time T3, the suspend operation is prohibited until the measured time of the timer 150 reaches the updated new threshold N2.

At time T4, the measured time of the timer 150 reaches the threshold N2. Consequently, at the time T4, the suspend permissible period starts, and the NAND controller 14_0 can issue the suspend command when the command to execute the operation OP2 is further received from the host device 3. When the controller operates as described above, the permission or the prohibition of the suspend operation during the execution of the operation OP1 can be switched in accordance with the measured time of the timer 150.

1.2.2 Flow Chart of Suspend Operation

Next, the suspend operation in the memory system according to the first embodiment will be described with reference to a flow chart shown in FIG. 7 and FIG. 8.

Figure 8:
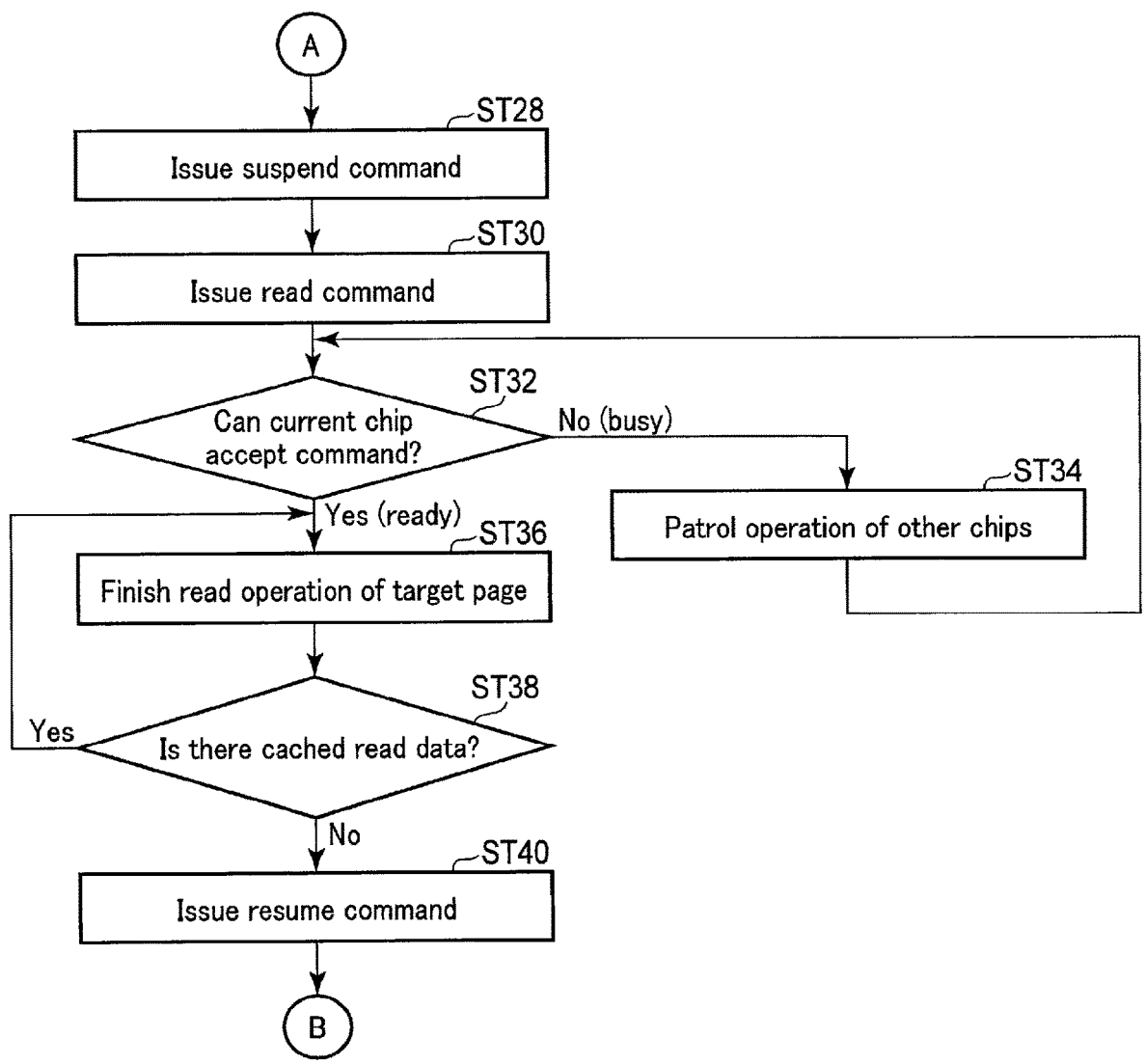
FIG. 8 is a flow chart to explain the suspend operation in the memory system according to the first embodiment.

FIG. 7 and FIG. 8 show divided flow charts including steps ST10 to ST40. FIG. 7 shows the steps ST10 to ST26, and FIG. 8 shows the steps ST28 to ST40. FIG. 7 and FIG. 8 show that in the chip 21, the write operation or the erase operation is being executed as an example of the operation OP1, and the read operation is executed as an example of the operation OP2. Furthermore, FIG. 7 and FIG. 8 show that the threshold N1 is beforehand associated with the timer 150 and that the timer 150 is reset so that the threshold N2 is associated therewith.

As shown in FIG. 7, the chip 21 starts the write operation or the erase operation as the operation OP1.

In the step ST10, the NAND controller 14_0 starts the timer 150. That is, the measured time of the timer 150 after the step ST10 corresponds to a time elapsed after the write operation or the erase operation in the chip 21 starts.

In step ST12, the NAND controller 14_0 performs a patrol operation of the other chips 22 to 24. Specifically, for example, the NAND controller 14_0 determines whether or not the write operation or the erase operation starts in the other chips 22 to 24. When the NAND controller 14_0 determines that the write operation or the erase operation has started in one of the chips 22 to 24, the controller executes processing of and after step ST14 to the chip as follows.

In the step ST14, the NAND controller 14_0 determines whether or not the chip 21 can accept the command.

When it is determines that the chip 21 can accept the command, i.e., when the chip 21 is in the ready state (Yes (ready) in the step ST14), the processing advances to step ST16.

In the step ST16, the NAND controller 14_0 issues a status read command, confirms that the write operation or the erase operation of the chip 21 finishes, and then finishes the operation in the chip.

On the other hand, when it is determined that the chip 21 cannot accept the command, i.e., when the chip 21 is in the busy state (No (busy) in the step ST14), the processing advances to step ST18.

In the step ST18, the NAND controller 14_0 issues the status read command, confirms that the chip 21 is executing the write operation or the erase operation, and acquires a status of each operation which is being executed in the chip 21. The status of the chip 21 includes, for example, information with which it can be determined whether or not the chip 21 can accept the suspend command. Details of the status to be acquired in each of the write operation and the erase operation will be described later.

In step ST20, the NAND controller 14_0 determines whether or not the chip 21 is in a state in which the suspend command can be accepted, on the basis of the acquired information.

When it is determined that the chip 21 is in a state in which the suspend command cannot be accepted (No in the step ST20), the processing advances to the step ST12.

When it is determined that the chip 21 is in the state in which the suspend command can be accepted (Yes in the step ST20), the processing advances to step ST22. In the step ST22, the NAND controller 14_0 determines the threshold N2. For example, the NAND controller 14_0 may measure a time until the status of the chip 21 acquired in the step ST18 changes from the unacceptable state to the acceptable state for the suspend command, and may determine the time as the threshold N2.

In the step ST24, the NAND controller 14_0 determines whether or not the period is the suspend permissible period (i.e., the measured time of the timer 150 is not less than the threshold N1) and whether or not a read command is received from the host device 3.

When the period is the suspend prohibiting period (i.e., the measured time of the timer 150 is less than the threshold N1) or no read command is received from the host device 3

(No in the step ST24), the processing returns to the step ST12. In this way, the NAND controller 14_0 performs status polling in the step ST18 and periodically monitors execution status of the chips 21 to 24, before shifting to the suspend operation. Then, the controller determines the threshold N2 in accordance with a change of the status of each of the chips 21 to 24.

On the other hand, when the period is the suspend permissible period and the read command comes from the host device 3 (Yes in the step ST24), the processing advances to the step ST26.

In the step ST26, the NAND controller 14_0 resets the measured time of the timer 150 to "0", and updates the threshold to be associated with the timer 150 from the threshold N1 to the threshold N2. It should be noted that in the step ST26, the measured time of the timer 150 is only reset, and the measuring is not resumed.

Subsequently, the steps ST28 to ST40 will be described with reference to FIG. 8.

As shown in FIG. 8, in the step ST28, the NAND controller 14_0 issues, to the chip 21, the suspend command to temporarily stop the erase operation or the write operation.

In step ST30, the NAND controller 14_0 issues the read command to execute the read operation to the chip 21 brought into the ready state by the suspend command. Consequently, the chip 21 starts the read operation while the erase operation or the write operation is temporarily stopped.

In step ST32, the NAND controller 14_0 determines whether or not the current chip (the chip 21) can accept the command.

When it is determined that the chip 21 cannot accept the command, i.e., when the chip 21 is in the busy state (No (busy) in the step ST32), it is determined that the chip 21 is executing the read operation, and the processing advances to step ST34.

In the step ST34, the NAND controller 14_0 performs the patrol operation of the other chips 22 to 24 while the chip 21 is executing the read operation. Specifically, for example, the NAND controller 14_0 determines whether or not there is a command issuable to the other chips 22 to 24, when the chip 21 is executing the read operation and is therefore in the busy state. When there is the command to be issued to one of the other chips 22 to 24 which is an operation target and the chip of the operation target is in the ready state, the NAND controller 14_0 issues the command to the chip of the operation target.

When it is determined that the chip 21 can accept the command, i.e., when the chip 21 is in the ready state (Yes (ready) in the step ST32), the processing advances to step ST36.

In the step ST36, the NAND controller 14_0 determines whether the read operation concerning a page of a read target in the chip 21 finishes, and the processing advances to step ST38.

In the step ST38, the NAND controller 14_0 determines whether or not cached read data corresponding to the read command issued in the step ST30 is in the page buffer 210 of the chip 21. When it is determined that there is the cached read data (Yes in the step ST38), the NAND controller 14_0 subsequently reads the cached read data from the chip 21 in the step ST36. When it is determined that there is not any cached read data (No in the step ST38), the NAND controller 14_0 determines that the read operation executed in the suspend operation finishes, and the processing advances to the step ST40. It should be noted that the operation in the step ST38 can also be executed, for example, when the NAND controller 14_0 issues the read command in the step ST30. The data can be cached in the page buffer 210, for example, when the data is continuously read from the same page address.

In the step ST40, the NAND controller 14_0 issues, to the chip 21, the resume command to resume the erase operation or the write operation. Consequently, the chip 21 resumes the erase operation or the write operation. Afterward, the NAND controller 14_0 resumes the timer 150 in the step ST10.

As described above, a series of operations are executed in one suspend operation.

1.2.3 Details of Suspend Operation Next, details of the suspend operation in the memory system according to the first embodiment will be described.

1.2.3.1 Erase Operation Accompanied by Suspend Operation

The erase operation accompanied by the suspend operation of the memory system according to the first embodiment will be described with reference to FIG. 9.

Figure 9:
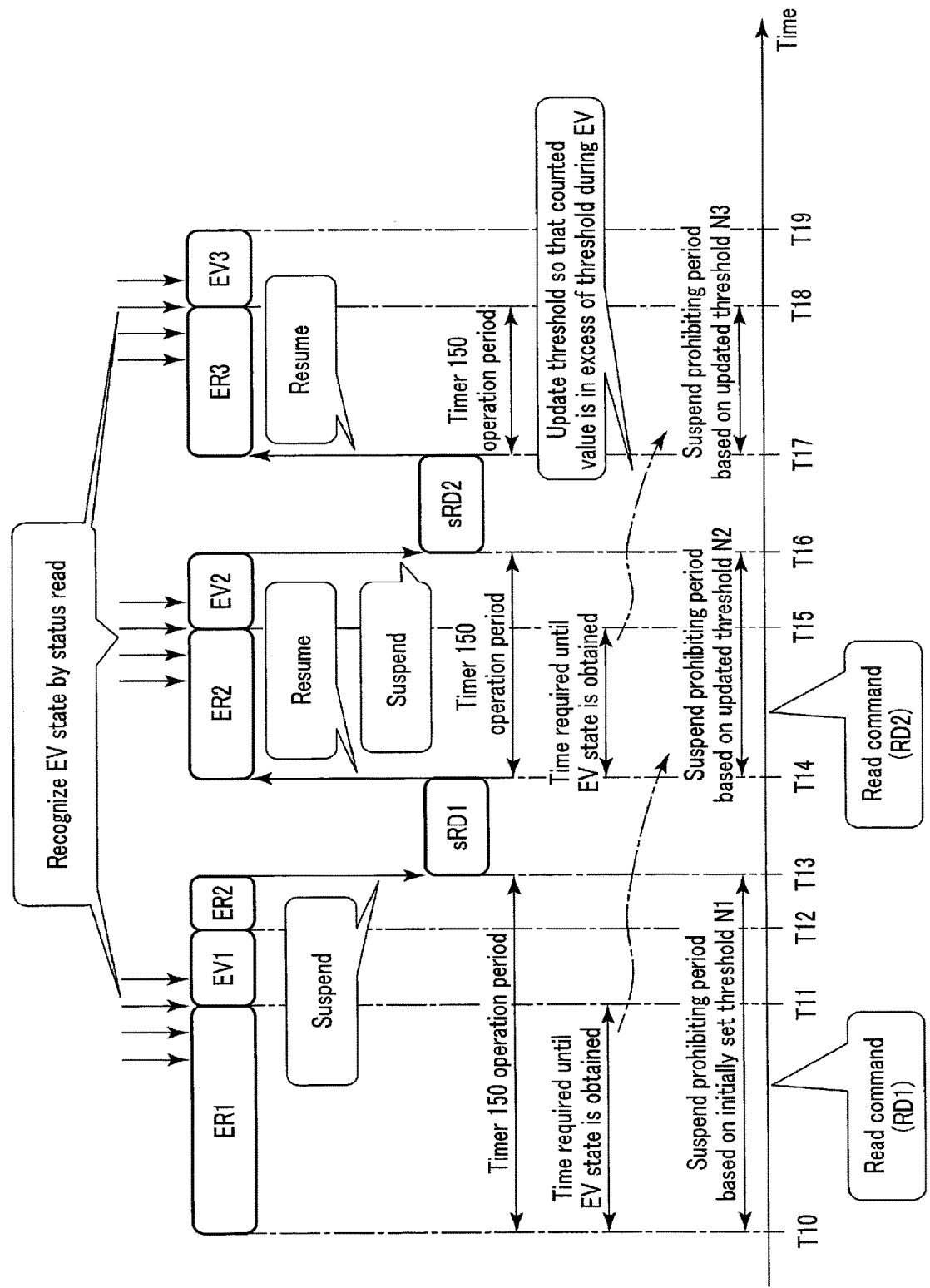
FIG. 9 is a schematic diagram to explain an erase operation accompanied by the suspend operation in the memory system according to the first embodiment.

FIG. 9 shows timings to execute the suspend operation when read commands (RD1 and RD2) are received from the host device 3 at different two timings during the erase operation. FIG. 9 shows that the threshold N1 initially set as the threshold to be associated with the timer 150 is updated to the threshold N2 during the erase operation, and the threshold N2 is further updated to a threshold N3.

As shown in FIG. 9, the erase operation includes erase processing (ER: erase) (ER1 to ER3) and erase verify processing (EV: erase verify) (EV1 to EV3). The erase processing ER is processing of extracting a charge stored by the write operation in the charge storage layer 35 of the memory cell transistor MT and lowering the threshold voltage. The erase verify processing EV is processing of verifying whether or not the threshold voltage is lowered down to a predetermined level by the immediately preceding erase processing ER. In the erase operation, the erase processing ER and the erase verify processing EV are alternately repeated until the charge stored by the write operation in the charge storage layer 35 is substantially extracted. According to the example of FIG. 9, in the erase operation, first erase processing ER1 and first erase verify processing EV1, second erase processing ER2 and second erase verify processing EV2 and third erase processing ER3 and third erase verify processing EV3 are executed in this order.

Initially at time T10, the erase processing ER1 is started. Accordingly, the NAND controller 14_0 starts the timer 150. The erase processing ER1 is executed over a period of time T10 to time T11. Furthermore, the erase verify processing EV1 is executed subsequently over a period of the time T11 to time T12. Then, when the erase verify processing EV1 finishes at the time T12, another erase processing ER2 is started.

It should be noted that in the example of FIG. 9, the measured time of the timer 150 does not reach the threshold N1 at the time T12. Consequently, the period till the time T12 is the suspend prohibiting period, and the NAND controller 14_0 does not issue the suspend command at the time T12 even when receiving the read command RD1 from the host device 3 in the period after the time T10.

When the measured time of the timer 150 is not less than the threshold N1 at time T13, the NAND controller 14_0 issues the suspend command and the read command in accordance with the read command RD1, to execute read processing sRD1. When the read processing sRD1 finishes at time T14, the NAND controller 14_0 issues the resume command and resumes the erase operation.

However, the erase processing ER2 cannot resume from a state at the point of time when the processing was temporarily stopped. Consequently, in the erase processing ER2 to be started from the time T14, the operation executed from the time T12 to the time T13 should be executed again. In this way, when the suspend operation is executed during the erase processing ER2, the erase processing ER2 executed before the processing is suspended becomes vain, and a time required to execute the whole erase operation increases as much as a period of the time T12 to the time T13.

Furthermore, when the re-execution of the erase processing ER due to the suspension occurs every write/erase cycle, the memory cell transistor MT deteriorates further, and life of the chip 21 might be shortened.

On the other hand, the erase verify processing EV can be resumed from a point of time at which the processing was temporarily stopped. Consequently, assuming that the suspend operation is executed during the erase verify processing EV1, the erase verify processing EV1 executed before the suspend does not become vain, and the increase in the time required to execute the whole erase operation can be prevented. Therefore, it is preferable that the suspend operation in the erase operation is executed during the erase verify processing EV and the suspend operation during the erase processing ER is avoided.

Therefore, as described with reference to FIG. 7, the NAND controller 14_0 performs the status polling, thereby monitoring the status of the chip 21 during the erase operation. Consequently, at the time T11, the NAND controller 14_0 can recognize that the status of the chip 21 changes from a state of executing the erase processing ER1 to a state of executing the erase verify processing EV1, and can know a time (T11-T10) necessary for the erase verify processing EV1 to start.

The NAND controller 14_0 determines the new threshold N2 on the basis of the time (T11-T10). That is, a value determined before executing the erase operation is applied to the threshold N1, whereas a value which reflects the time actually required to execute the erase processing ER1 is applied to the threshold N2. Consequently, on the basis of the execution status of the immediately preceding erase processing ER1, the NAND controller 14_0 can accurately adjust a value of the threshold N2 so that the measured time of the timer 150 becomes not less than the threshold N2 during the erase verify processing EV2 (preferably at a time point of completion of the erase processing ER2).

Assuming that the threshold N1 is set so that the suspend prohibiting period ends during the erase processing ER1, the suspend operation is executed before the processing shifts to the erase verify processing EV1. That is, the suspend operation is executed before the time required to shift to the erase verify processing EV1 is acquired by the status read. Therefore, the threshold N2 might not be able to be determined on the basis of the time required to shift to the erase verify processing EV1. Consequently, for the purpose of certainly executing the operation of determining the threshold N2, it is preferable that the initially set threshold N1 is a large value to such an extent that at least the erase verify processing EV1 can be started in the suspend prohibiting period.

At the time T14, the erase processing ER2 is resumed. Accordingly, the NAND controller 14_0 starts the timer 150 anew. The erase processing ER2 is executed over a period of the time T14 to time T15. Furthermore, the erase verify processing EV2 is executed subsequently over a period of the time T15 to time T16.

In the example of FIG. 9, the measured time of the timer 150 reaches the threshold N2 at the time T16 during the erase verify processing EV2. At the time T16, the NAND controller 14_0 issues the suspend command and the read command in accordance with the read command RD2 received in a period of the time T14 to the time T16, to execute read processing sRD2. When the read processing sRD2 finishes at time T17, the NAND controller 14_0 issues the resume command and resumes the erase operation.

As described above, the NAND controller 14_0 performs the status polling. Consequently, at the time T15, the NAND controller 14_0 can recognize that the status of the chip 21 changes from a state of executing the erase processing ER2 to a state of executing the erase verify processing EV2, and can know a time (T15-T14) required for the erase verify processing EV2 to start.

The NAND controller 14_0 determines the new threshold N3 on the basis of the time (T15-T14). Consequently, on the basis of the execution status of the immediately preceding erase processing ER2, the NAND controller 14_0 can accurately adjust a value of the threshold N3 so that the measured time of the timer 150 becomes not less than the threshold N3 during the erase verify processing EV3 (preferably at a time point of completion of the erase processing ER3).

At the time T17, the erase processing ER3 starts. Accordingly, the NAND controller 14_0 starts the timer 150 anew. The erase processing ER3 is executed over a period of the time T17 to time T18. Furthermore, the erase verify processing EV3 is executed subsequently over a period of the time T18 to time T19.

When the operation is performed as described above, the erase operation accompanied by the suspend operation is executed with updating the threshold N1 to the threshold N2 and updating the threshold N2 to the threshold N3.

It should be noted that as described above, the erase processing ER and erase verify processing EV are repeatedly executed. Consequently, even when the measured time of the timer 150 is not less than the threshold at the completion of the erase processing ER, there is a possibility that a read command is received while the subsequent erase processing ER is further executed. In this case, it is not preferable that the suspend operation is executed while the erase processing ER is being executed. Therefore, when the NAND controller 14_0 confirms that the status of the chip 21 changes from the erase verify processing EV to the next erase processing ER, the controller may reset the measuring of the timer 150, restart the measuring and resume the suspend prohibiting period.

1.2.3.2 Write Operation Accompanied by Suspend Operation

Next, the write operation accompanied by the suspend operation in the memory system according to the first embodiment will be described with reference to FIG. 10.

Figure 10:
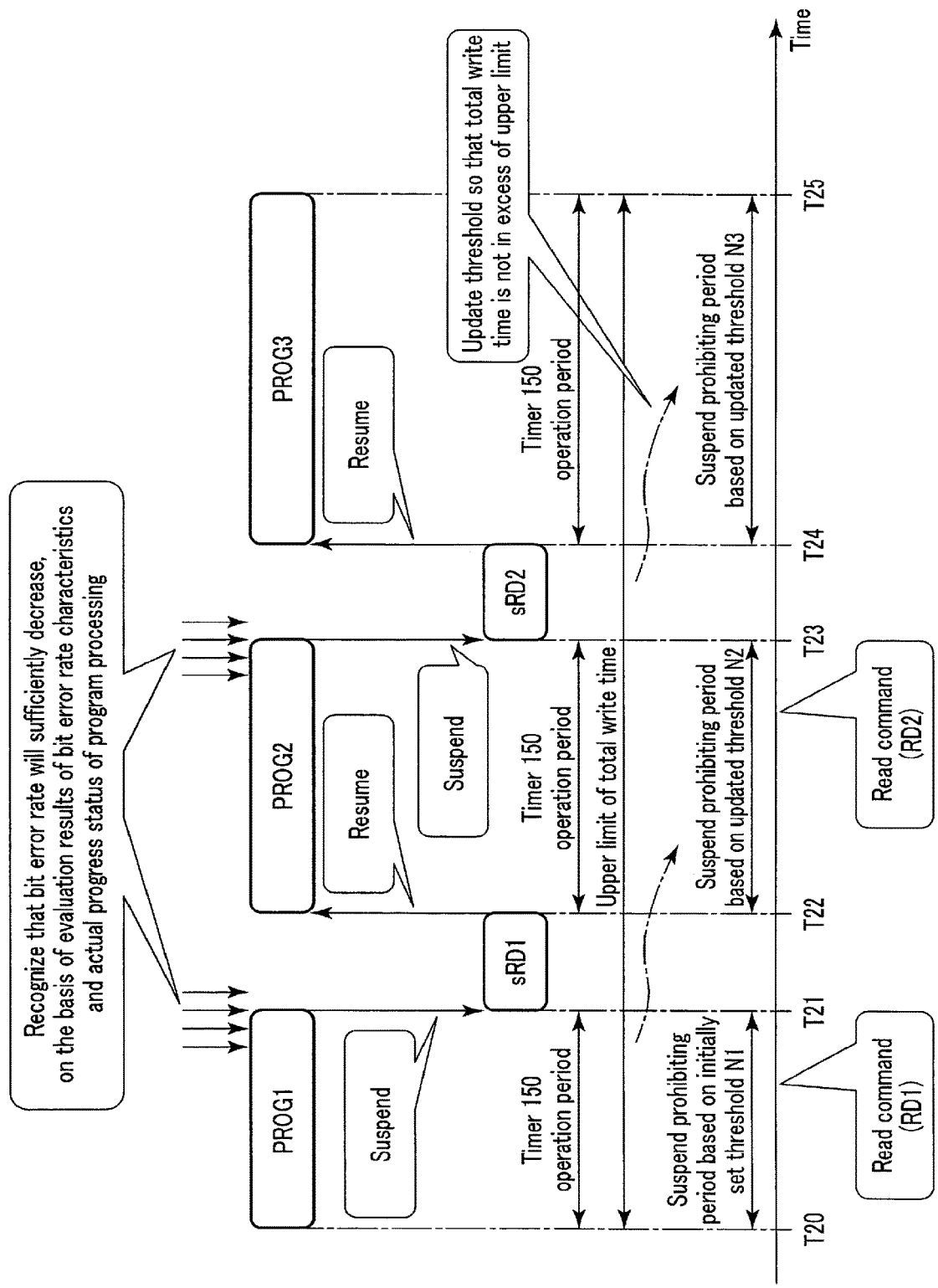
FIG. 10 is a schematic diagram to explain a write operation accompanied by the suspend operation in the memory system according to the first embodiment.

FIG. 10 shows timings to execute the suspend operation when read commands (RD1 and RD2) are received from the host device 3 at two different timings during the write operation. FIG. 10 shows that the threshold N1 initially set as the threshold to be associated with the timer 150 is updated to the threshold N2 during the write operation, and the threshold N2 is further updated to the threshold N3.

The write operation includes program processing and program verify processing which is not shown in the drawing. The program processing is processing for storing the charge in the charge storage layer 35 and raising the threshold voltage. The program verify processing for processing of verifying whether or not the threshold voltage is raised up to a predetermined level by the program processing. In the write operation, the program processing and the program verify processing are alternately repeated. In the following description, the program processing and the program verify processing are not distinguished, and are simply called program processing PROG (PROG1 to PROG3).

According to the example of FIG. 10, in the write operation, first program processing PROG1, second program processing PROG2 and third program processing PROG3 are executed in this order.

As shown in FIG. 10, initially at time T20, the program processing PROG1 starts. Accordingly, the NAND controller 14_0 starts the timer 150.

In the example of FIG. 10, the measured time of the timer 150 does not reach the threshold N1 until time T21 is reached. Consequently, a period till the time T21 is the suspend prohibiting period, and the NAND controller 14_0 cannot issue the suspend command even when receiving the read command RD1 from the host device 3 between the time T20 and the time T21.

When the measured time of the timer 150 is not less than the threshold N1 at the time T21, the NAND controller 14_0 issues the suspend command and the read command in accordance with the read command RD1, to execute the read processing sRD1. When the read processing sRD1 finishes at time T22, the NAND controller 14_0 issues the resume command, to resume the write operation.

The program processing PROG can be resumed from a state at a point of time when the processing was temporarily stopped, regardless of whether or not the processing is the program processing or the program verify processing. Therefore, a time required to execute the whole write operation does not change, though the time required to execute the erase operation changes depending on whether the erase processing ER or the erase verify processing EV is performed at the time of the suspend. However, when the program processing PROG is stopped in an initial stage, a bit error rate may increase. Consequently, when the suspend operation is executed immediately after the program processing PROG starts, there is a possibility that reliability of the data held in the chip 21 deteriorates.

To eliminate such a problem, the NAND controller 14_0 can beforehand acquire, as bit error rate characteristics of the chip 21, information indicating a progress of the program processing PROG to sufficiently decrease the bit error rate, on the basis of results of characteristics evaluation and the like performed in advance. Furthermore, the NAND controller 14_0 performs the status polling, to acquire, as a status, information indicating the progress of the program processing PROG (a progress status of the program processing PROG). Consequently, at the time T21, the NAND controller 14_0 can recognize that a bit error rate of the chip 21 will sufficiently decrease.

The NAND controller 14_0 can determine a new threshold N2, on the basis of a time required for the bit error rate not to increase. That is, the value determined before executing the write operation is applied to the threshold N1, but a value which reflects a time actually required to execute the program processing PROG1 is applied to the threshold N2. In consequence, the NAND controller 14_0 can accurately adjust a value of the threshold N2 so that the measured time of the timer 150 does not reach the threshold N2 or more in a time period in which the bit error rate may increase, on the basis of an execution status of the immediately preceding program processing PROG1.

Furthermore, the NAND controller 14_0 may determine an upper limit of a total write time required to execute the whole write operation. In this case, the NAND controller 14_0 may set the value of the threshold N2 so that the time required to execute the whole write operation is not in excess of the upper limit of the total write time, when a large number of suspend operations are expected to be executed in the write operation. Specifically, the NAND controller 14_0 may set a value larger than the threshold N1 to the threshold N2.

At the time T22, the write operation is resumed, and the program processing PROG2 is executed. Accordingly, the NAND controller 14_0 starts the timer 150 anew.

In the example of FIG. 10, the measured time of the timer 150 reaches the threshold N2 at time T23. The NAND controller 14_0 issues the suspend command and the read command in accordance with the read command RD2, to execute the read processing sRD2. When the read processing sRD2 finishes at time T24, the NAND controller 14_0 issues the resume command, to resume the write operation.

As described above, the NAND controller 14_0 performs the status polling. Consequently, at the time T23, the NAND controller 14_0 can recognize the bit errors of the chip 21 will sufficiently decrease and can know the time required for the bit error rate not to increase.

The NAND controller 14_0 can determine a new threshold N3 on the basis of the time required for the bit error rate not to increase. Consequently, the NAND controller 14_0 can accurately adjust a value of the threshold N3 so that the measured time of the timer 150 does not reach the threshold N3 or more in the time period in which the bit error rate may increase, on the basis of an execution status of the immediately preceding program processing PROG2.

Furthermore, the NAND controller 14_0 may set a value larger than the threshold N2 to the threshold N3 to conform to the upper limit of the total write time. In consequence, the threshold can be set to lengthen the suspend prohibiting period at every suspend operation.

At the time T24, the write operation is resumed, and the program processing PROG3 is executed. Accordingly, the NAND controller 14_0 starts the timer 150 anew. The program processing PROG3 is executed over a period of the time T24 to time T25.

When the operation is performed as described above, the write operation accompanied by the suspend operation is executed with updating the threshold N1 to the threshold N2 and updating the threshold N2 to the threshold N3.

1.3 Effect of Present Embodiment

According to the first embodiment, an execution efficiency of the whole operation can be improved while improving latency of the read operation. Hereinafter, effects of the present embodiment will be described.

In the NAND-type flash memory, a busy time of several milliseconds (ms) might be taken in the erase operation or the write operation. Therefore, waiting for the completion of the erase operation or the write operation to execute the read operation might deteriorate the latency of the read operation.

To address such a problem, the memory system including the NAND-type flash memory has a function of suspending the erase operation or the write operation which is being executed, to execute the read operation, by use of the suspend command. However, depending on the execution status of the erase operation and the write operation, the latency of the whole operation or the execution efficiency of the operation might contrarily deteriorate, when the erase or write operation is suspended to execute the read operation.

According to the first embodiment, the NAND controller 14_0 has the timer 150. The control circuit 141 starts the timer 150 simultaneously at the start of the execution of the erase operation or the write operation in the chip 21, and prohibits the issuance of the suspend command until the measured time of the timer 150 reaches the predetermined threshold N1. During the erase operation or the write operation, the control circuit 141 acquires the status of the chip 21, to obtain the time required for the status to change to the state where the suspend command can be issued. Then, the control circuit 141 updates the value of the threshold to be associated with the timer 150, after re-started, from the threshold N1 to the threshold N2 in accordance with the obtained time.

In consequence, even when the suspend operation is executed in accordance with the initially set threshold N1 that might cause the execution efficiency of the whole operation to deteriorate, the threshold N2 is more appropriately changed to execute the suspend operation at a timing when the deterioration of the execution efficiency does not occur.

Specifically, in the case of the erase operation, the control circuit 141 acquires the status of the chip 21 indicating whether the chip is executing the erase processing ER or the erase verify processing EV, and determines the threshold N2 in accordance with the time required for the erase processing ER to shift to the erase verify processing EV. In consequence, the deterioration of the execution efficiency might be prevented.

In addition, when the suspend operation occurs during the erase processing ER, the erase processing ER to be executed after the suspend operation includes the erase processing ER executed before the suspend operation. On the other hand, when the suspend operation occurs during the erase verify processing EV, the erase verify processing EV executed before the suspend operation does not have to be executed again after the suspend operation. Thus, it is preferable to execute the suspend operation during the erase verify processing EV, in the erase operation. The control circuit 141 can predict a time which is considered to be next required from the erase processing ER2 to the erase verify processing EV2, on the basis of the time actually required from the erase processing ER1 to the erase verify processing EV1. In consequence, the control circuit 141 can determine the threshold N2 so that the suspend prohibiting period ends during the erase verify processing EV2.

In the case of the write operation, the control circuit 141 beforehand acquires the bit error rate characteristics from prior evaluations or the like, acquires an actual progress of the program processing PROG as the status, and recognizes that the bit error rate will sufficiently decrease. Then, the control circuit 141 determines the threshold N2 in accordance with a time required for the bit error rate to sufficiently decrease. In consequence, the deterioration of the execution efficiency of the operation might be prevented.

In addition, when the suspend operation occurs in the initial stage of the program processing PROG, the bit error rate of each cell into which data is written before the suspend operation occurs might increase. Thus, in the write operation, it is preferable to execute the suspend operation, after the time from the start of the program processing PROG elapses to such an extent that the bit error rate will not increase. The control circuit 141 can presume the time which is next required to sufficiently decrease the bit error rate during the program processing PROG2, on the basis of the time actually required to sufficiently decrease the bit error rate during the program processing PROG1. In consequence, the control circuit 141 can determine the threshold N2 so that the suspend prohibiting period ends while the bit error rate will not increase, even when the program processing PROG2 is suspended.

Furthermore, when the suspend operation occurs in the write operation, the control circuit 141 can set the threshold N2 to be larger than the threshold N1. In consequence, every time the suspend operation is executed, the suspend prohibiting period is set to be longer, and as a result, it is possible to limit the number of times of the suspend operations to be executed during the write operation. In consequence, it is possible to prevent the time required to execute the whole write operation from being in excess of the upper limit of the total write time, and additionally, the deterioration of the execution efficiency of the operation might be prevented.

2. Second Embodiment

Next, a memory system according to a second embodiment will be described. With the memory system according to the second embodiment, an operation when read commands to read multiple pages are continuously received from a host device 3 is explained. In the following description, description is omitted as to the same configurations and operations as in the first embodiment, and configurations and operations different from those of the first embodiment are mainly described.

2.1 Flow Chart of Suspend Operation

A suspend operation in the memory system according to the second embodiment will be described with reference to a flow chart shown in FIG. 11.

Figure 11:
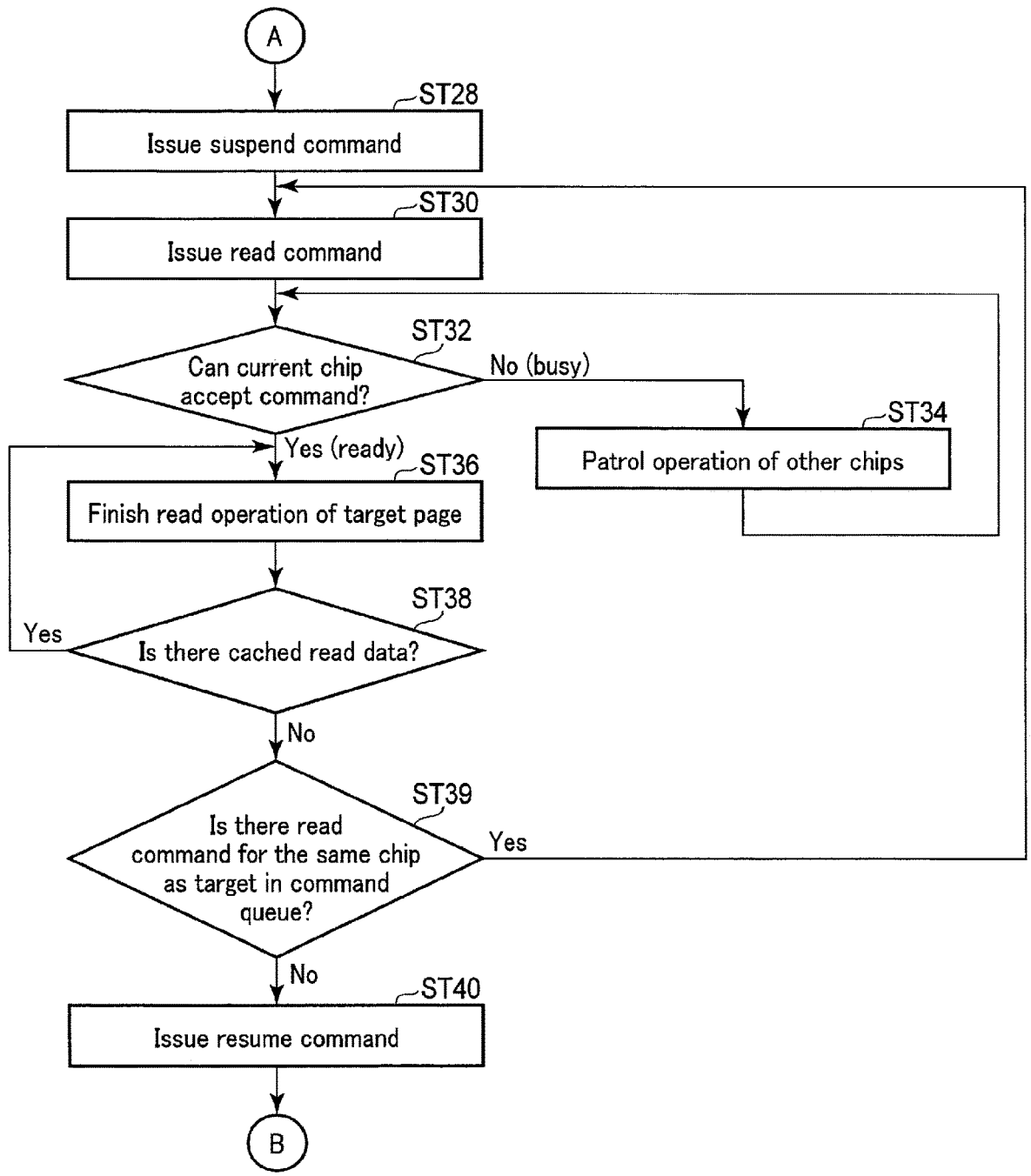
FIG. 11 is a flow chart to explain a suspend operation in a memory system according to a second embodiment.

FIG. 11 shows step ST28 to step ST40 corresponding to FIG. 8 described in the first embodiment. It should be noted that an operation from step ST10 to step ST26 in the second embodiment is similar to the operation described in the first embodiment with reference to FIG. 7.

As shown in FIG. 11, an operation from the step ST28 to step ST38 is similar to the operation from step ST28 to step ST38 of FIG. 8, and hence, description is omitted.

In step ST39, a NAND controller 14_0 confirms whether or not the read command for the same chip as the target is stored in a command queue 145.

When the read command for the same chip as the target is stored in the command queue 145 (Yes in the step ST39), the processing returns to step ST30. The NAND controller 14_0 executes the read command in the command queue 145 sequentially during the same suspend operation.

When the read command is not stored in the command queue 145 (No in the step ST39), the processing advances to the step ST40.

In the step ST40, the NAND controller 14_0 issues, to a chip 21, a resume command to resume an erase operation or a write operation. Consequently, the chip 21 resumes the erase operation or the write operation.

Afterward, the NAND controller 14_0 resumes the timer 150 in step ST10.

As described above, a series of operations are executed in one suspend operation.

2.2 Erase Operation Accompanied by Suspend Operation

Next, the erase operation accompanied by the suspend operation of the memory system according to the second embodiment will be described with reference to FIG. 12. It should be noted that the description is omitted as to the write operation accompanied by the suspend operation according to the second embodiment, a write operation accompanied by the suspend operation is executable in accordance with the flow chart of FIG. 11, in the same manner as in the erase operation described as follows.

Figure 12:
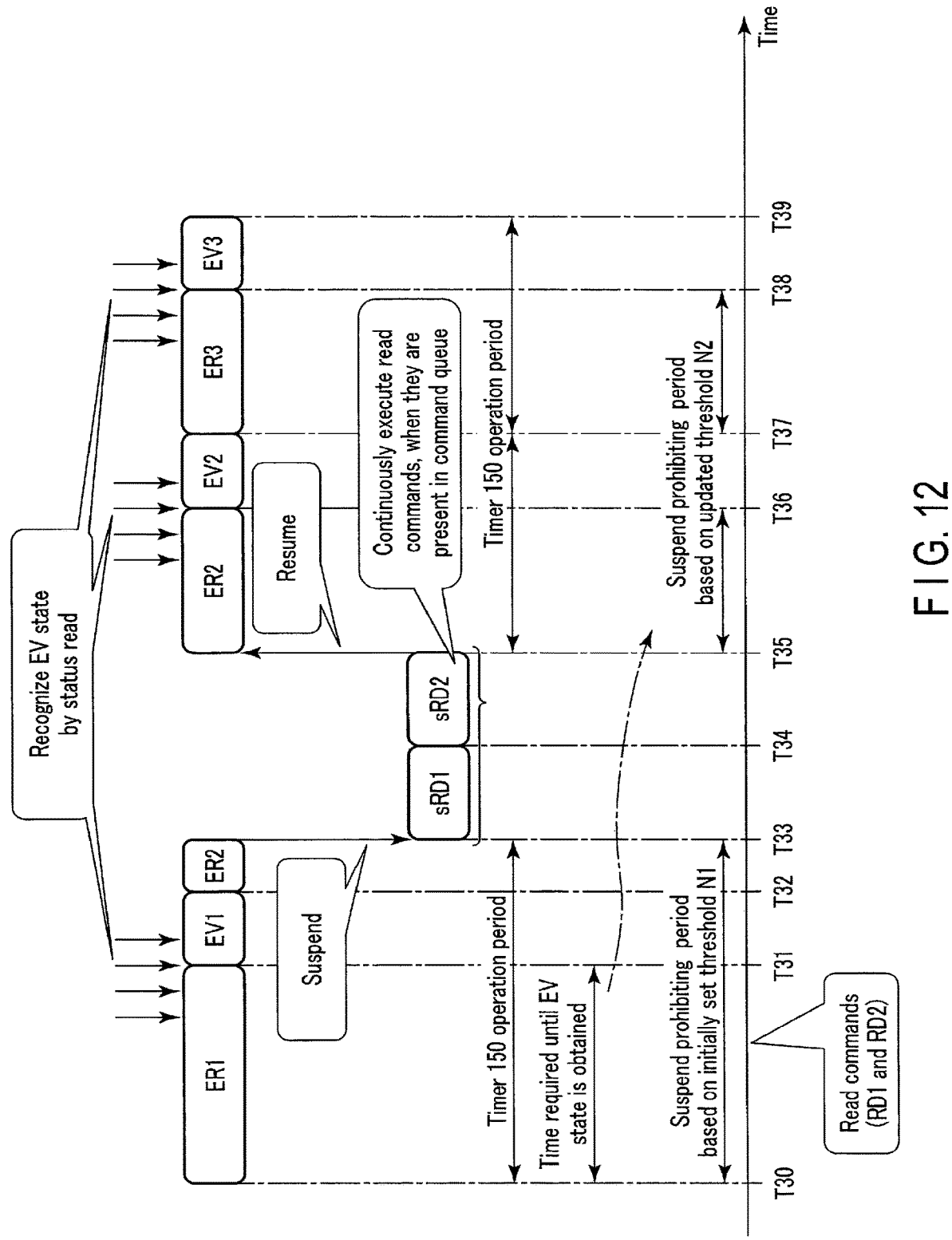
FIG. 12 is a schematic diagram to explain an erase operation accompanied by the suspend operation in the memory system according to the second embodiment.

FIG. 12 shows timings to execute the suspend operation when multiple read commands (RD1 and RD2) are received at the same timing from the host device 3 during the erase operation.

According to the example of FIG. 12, in the erase operation, first erase processing ER1 and erase verify processing EV1, second erase processing ER2 and erase verify processing EV2 and third erase processing ER3 and erase verify processing EV3 are executed in this order.

As shown in FIG. 12, initially at time T30, the erase processing ER1 is stated. Accordingly, the NAND controller 14_0 starts the timer 150. The erase processing ER1 is executed over a period of the time T30 to time T31. Furthermore, the erase verify processing EV1 is executed subsequently over a period of the time T31 to time T32. Then, when the erase verify processing EV1 finishes at time T32, the next erase processing ER2 is started.

It should be noted that in the example of FIG. 12, a measured time of the timer 150 does not reach a threshold N1 at the time T32. Consequently, a period till the time T32 is a suspend prohibiting period, and the NAND controller 14_0 cannot issue a suspend command at the time T32, even when receiving the read commands RD1 and RD2 from the host device 3 in a period after the time T30.

When the measured time of the timer 150 is not less than the threshold N1 at a time T33, the NAND controller 14_0 issues the suspend command and the read command in accordance with the read command RD1, to execute read processing sRD1. When the read processing sRD1 finishes at time T34, the NAND controller 14_0 subsequently issues the read command in accordance with the read command RD2, to execute read processing sRD2. When the read processing sRD2 finishes at time T35, the NAND controller 14_0 issues the resume command, to resume the erase operation.

Furthermore, the NAND controller 14_0 performs status polling. Consequently, at the time T31, the NAND controller 14_0 recognizes that a status of the chip 21 changes from a state of executing the erase processing ER1 to a state of executing the erase verify processing EV1, and determines a new threshold N2 on the basis of a time (T31-T30). The suspend prohibiting period based on the threshold N2 is set to, for example, a period of the time T35 to time T36.

The erase processing ER2 and the erase verify processing EV2 are executed in the period of the time T35 to the time T36 and a period of the time T36 to time T37, respectively. Furthermore, the erase processing ER3 and the erase verify processing EV3 are executed in the period of the time T37 to time T38 and a period of the time T38 to time T39, respectively. At the time T37, the NAND controller 14_0 recognizes that the status of the chip 21 changes from the erase verify processing EV2 to the erase processing ER3, and may reset and restart the measuring of the timer 150, to resume the suspend prohibiting period.

When the operation is performed as described above, the erase operation accompanied by the suspend operation is executed while updating the threshold N1 to the threshold N2.

2.3 Effect of Present Embodiment

According to the second embodiment, the NAND controller 14_0 controls the chip 21 to execute the read commands RD1 and RD2 received from the host device 3 until the suspend command is issued, in one suspend operation. In consequence, the number of times of suspension in the erase operation or the write operation can decrease, and a time required to read data after the read command RD2 is received can be reduced. In consequence, an execution efficiency of the whole operation can be improved, while improving latency of a read operation.

3. Third Embodiment

Next, a memory system according to a third embodiment will be described. The memory system according to the third embodiment recognizes a read command of a high priority, and preferentially executes the read command of the high priority even in a suspend prohibiting period. In the following description, description is omitted as to the same configurations and operations as in the first embodiment, and configurations and operations different from those of the first embodiment are mainly described.

3.1 Flow Chart of Suspend Operation

A suspend operation in the memory system according to the third embodiment will be described with reference to a flow chart shown in FIG. 13.

Figure 13:
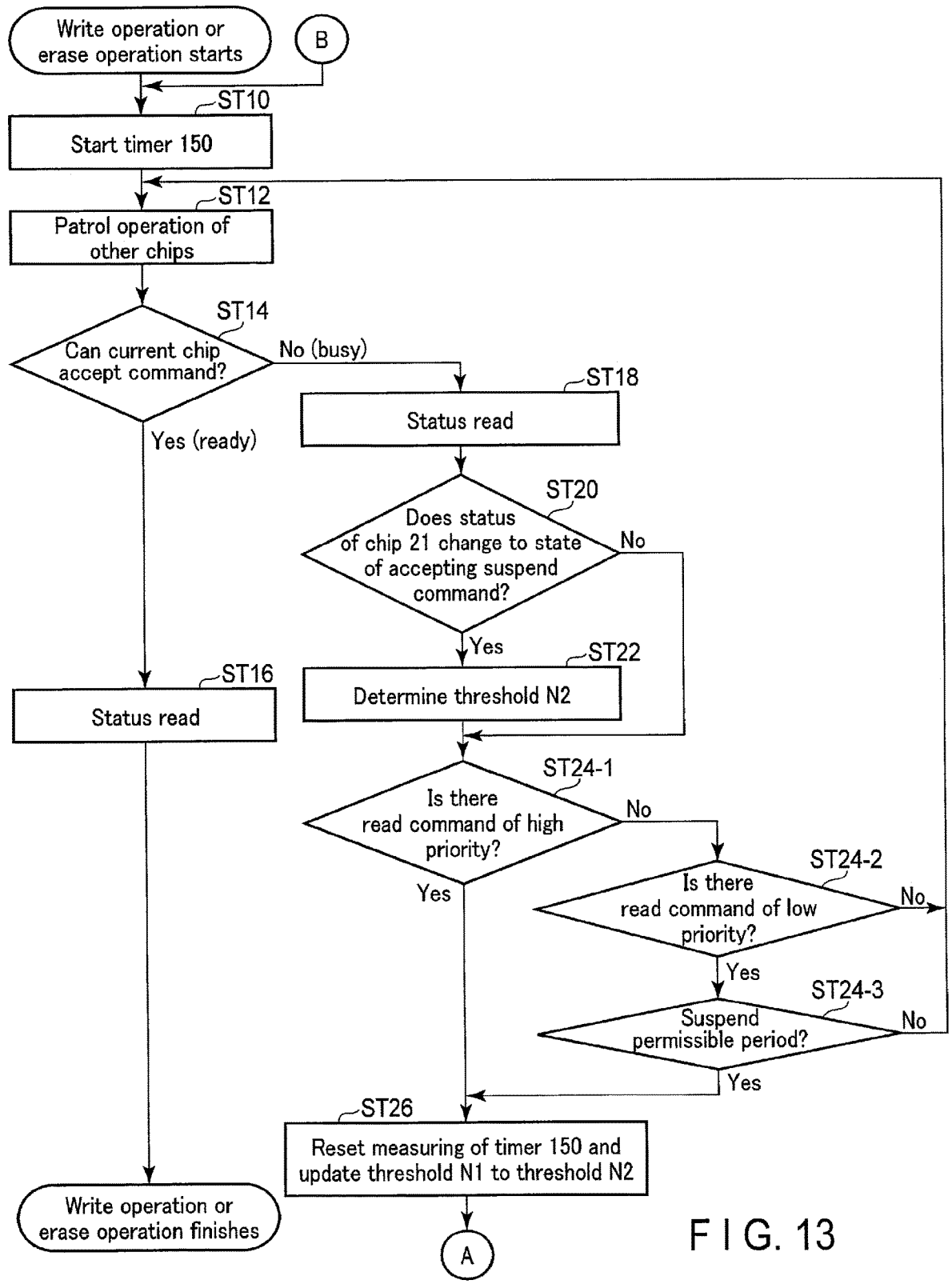
FIG. 13 is a flow chart to explain a suspend operation in a memory system according to a third embodiment.

FIG. 13 corresponds to FIG. 7 described in the first embodiment, and shows step ST10 to step ST26. It should be noted that an operation from step ST28 to step ST40 in the third embodiment is similar to an operation described in the first embodiment with reference to FIG. 8 and hence, description is omitted.

As shown in FIG. 13, the operation from the step ST10 to step ST22 is similar to the operation from the step ST10 to the step ST22 of FIG. 7, and hence, description is omitted.

In step ST24_1, a NAND controller 14_0 determines whether or not a read command of a high priority is received from a host device 3. The read command of the high priority is a read command including an instruction for the NAND controller 14_0 to output read data to the host device 3 within a predetermined period. When there is not the read command of the high priority (No in the step ST24_1), the processing advances to step ST24_2. When there is the read command of the high priority (Yes in the step ST24_1), the processing advances to the step ST26.

In the step ST24_2, the NAND controller 14_0 determines whether or not a read command of a low priority is received from the host device 3. The read command of the low priority is, for example, a read command which is not determined to be the read command of the high priority in the step ST24_1. When there is not the read command of the low priority (i.e., when there is not the read command irrespective of the high or low priority) (No in the step ST24_2), the processing returns to step ST12. When there is the read command of the low priority (Yes in the step ST24_2), the processing advances to step ST24_3.

In the step ST24_3, the NAND controller 14_0 determines whether or not the current period is a suspend permissible period (i.e., a measured time of a timer 150 is not less than a threshold N1). In the case of the suspend prohibiting period (i.e., when the measured time of the timer 150 is less than the threshold N1) (No in the step ST24_3), the processing returns to the step ST12. In the case of the suspend permissible period (Yes in the step ST24_3), the processing advances to the step ST26.

In the step ST26, the NAND controller 14_0 resets the measured time of the timer 150 to "0", and updates a threshold to be associated with the timer 150 from the threshold N1 to a threshold N2.

Afterward, steps ST28 to ST40 are executed, thereby finishing a series of operations executed while the suspend operation is executed once.

3.2 Erase Operation Accompanied by Suspend Operation

Next, an erase operation accompanied by the suspend operation of the memory system according to the third embodiment will be described with reference to FIG. 14. It should be noted that the description is omitted as to a write operation accompanied by the suspend operation of the memory system according to the third embodiment, but the write operation accompanied by the suspend operation is executable in accordance with a flow chart of FIG. 13 in the same manner as in the erase operation described as follows.

Figure 14:
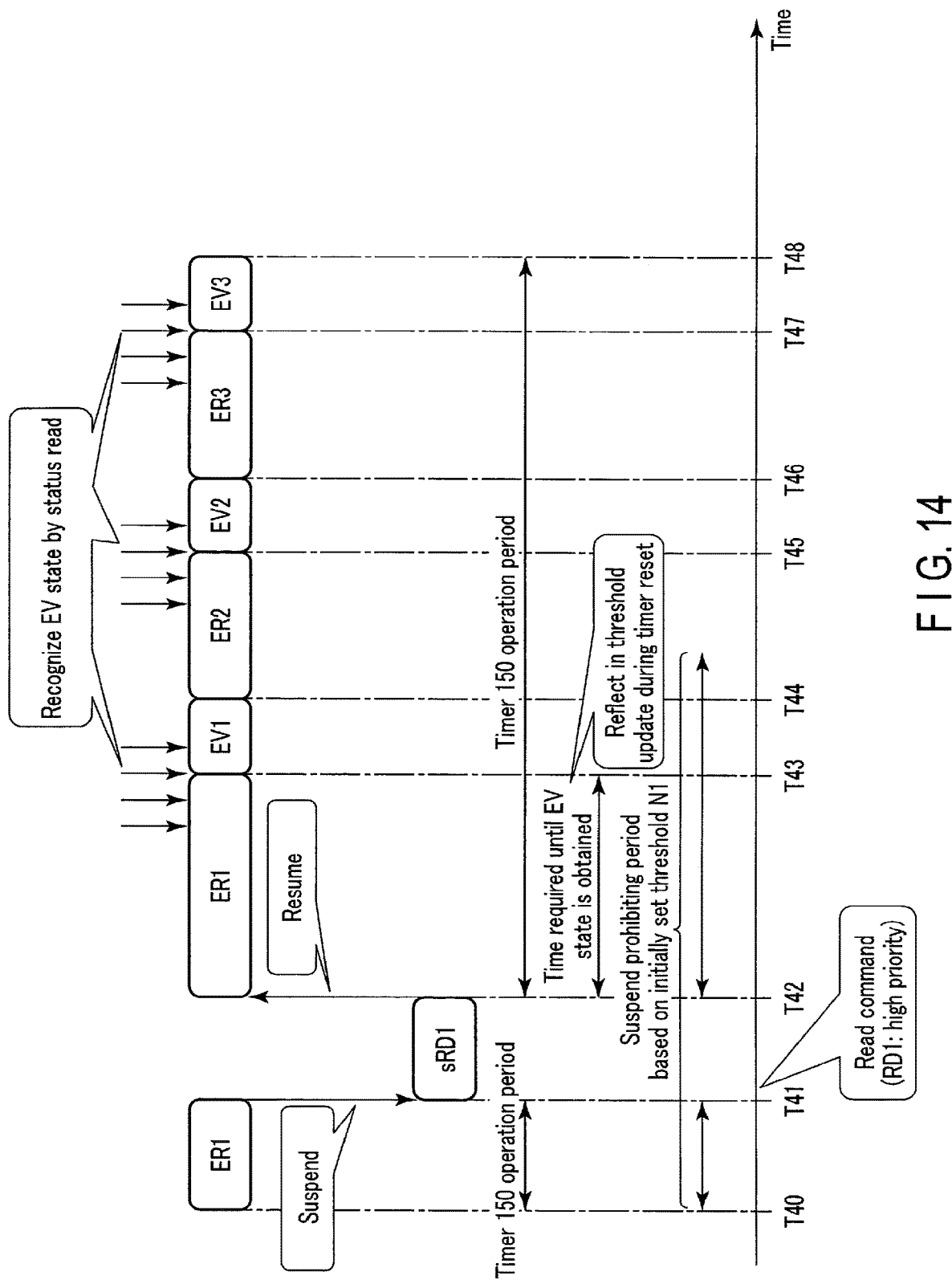
FIG. 14 is a schematic diagram to explain an erase operation accompanied by the suspend operation in the memory system according to the third embodiment.

FIG. 14 shows a timing to execute the suspend operation when the read command of the high priority (RD1) is received from the host device 3 during the erase operation.

According to an example of FIG. 14, in the erase operation, first erase processing ER1 and erase verify processing EV1, second erase processing ER2 and erase verify processing EV2 and third erase processing ER3 and erase verify processing EV3 are executed in this order.

As shown in FIG. 14, initially at time T40, the erase processing ER1 starts. Accordingly, the NAND controller 14_0 starts the timer 150.

It should be noted that in the example of FIG. 14, a measured time of the timer 150 does not reach the threshold N1 at time T41. Consequently, a period till the time T41 is the suspend prohibiting period, and the NAND controller 14_0 cannot issue a suspend command even when receiving a read command of a normal priority from the host device 3.

However, at the time T41, the NAND controller 14_0 receives the read command RD1 of the high priority from the host device 3. The NAND controller 14_0 recognizes that the priority of the read command RD1 is high, and issues the suspend command and the read command in accordance with the read command RD1 irrespective of the suspend prohibiting period or not, to execute read processing sRD1. When the read processing sRD1 finishes at time T42, the NAND controller 14_0 issues a resume command, to resume the erase operation.

As described above, the erase processing ER1 cannot resume from a state at the point of time when the processing was temporarily stopped. Consequently, in the erase processing ER1 resumed from the time T42, an operation executed from the time T40 to the time T41 is executed again.

Furthermore, the NAND controller 14_0 performs status polling, thereby monitoring a status of a chip 21 which is executing the erase operation. However, at the time T40, the status of the chip 21 is the state of executing the erase processing ER1, and hence, the NAND controller 14_0 does not determine a value of the threshold N2.

At the time T42, the erase processing ER1 is resumed. Accordingly, the NAND controller 14_0 starts the timer 150 anew. The erase processing ER1 is executed over a period of the time T42 to time T43. The erase verify processing EV1 is executed subsequently over a period of the time T43 to time T44.

The NAND controller 14_0 performs the status polling. Consequently, at the time T43, the NAND controller 14_0 recognizes that the status of the chip 21 changes from the state of executing the erase processing ER1 to the state of executing the erase verify processing EV1, and determines a new threshold N2 on the basis of a time (T43-T42). The threshold N2 is updated when the suspend operation is executed again during the subsequent erase operation.

When the erase verify processing EV1 finishes, the erase processing ER2 and the erase verify processing EV2 are executed in a period of the time T44 to time T45 and a period of the time T45 to time T46, respectively. Furthermore, the erase processing ER3 and the erase verify processing EV3 are executed in a period of the time T46 to time T47 and a period of the time T47 to time T48, respectively.

When the operation is performed as described above, the suspend operation is executed even in the suspend prohibiting period, in accordance with the read command RD1 of the high priority.

3.3 Effect of Present Embodiment

According to the third embodiment, the NAND controller 14_0 determines the priority of the read command RD1 received from the host device 3. When the NAND controller 14_0 determines that the priority of the read command RD1 is higher than a priority of the suspend prohibition, the controller issues the suspend command, and issues the read command in accordance with the read command RD1. In consequence, it is possible to immediately output read data to the host device 3 even in the suspend prohibiting period.

In addition, the host device 3 can command a memory system 2, for example, to output the read data in a limited time. Furthermore, assuming that the read data cannot be output in the limited time, the host device 3 can further command the memory system 2 to stop the reading of the data. In this case, the memory system 2 does not execute a read operation until the suspend prohibiting period ends, thereby causing the possibility that the read data cannot be output to the host device 3 in the limited time.

According to the third embodiment, when the read command RD1 designates the limited time, the NAND controller 14_0 determines that the priority of the read command RD1 is high. In consequence, the chip 21 can immediately execute the read operation irrespective of an execution status of the erase operation or the write operation, and can satisfy requirements from the host device 3. Therefore, an execution efficiency of the operation of the memory system 2 can be improved.

4. Fourth Embodiment

Next, a memory system according to a fourth embodiment will be described. In the memory system according to the fourth embodiment, in addition to a timer 150, there is another timer 151 which prohibits a suspend operation, when a measured time reaches a threshold. In the following description, description is omitted as to the same configurations and operations as in the first embodiment, and configurations and operations different from those of the first embodiment are mainly described.

4.1 Outline of Suspend Operation

Initially, an outline of the suspend operation in the memory system according to the fourth embodiment is described.

In the memory system according to the fourth embodiment, a suspend prohibiting period based on the timer 151 is further provided in addition to a suspend prohibiting period based on the timer 150 described in the first embodiment.

Figure 15:
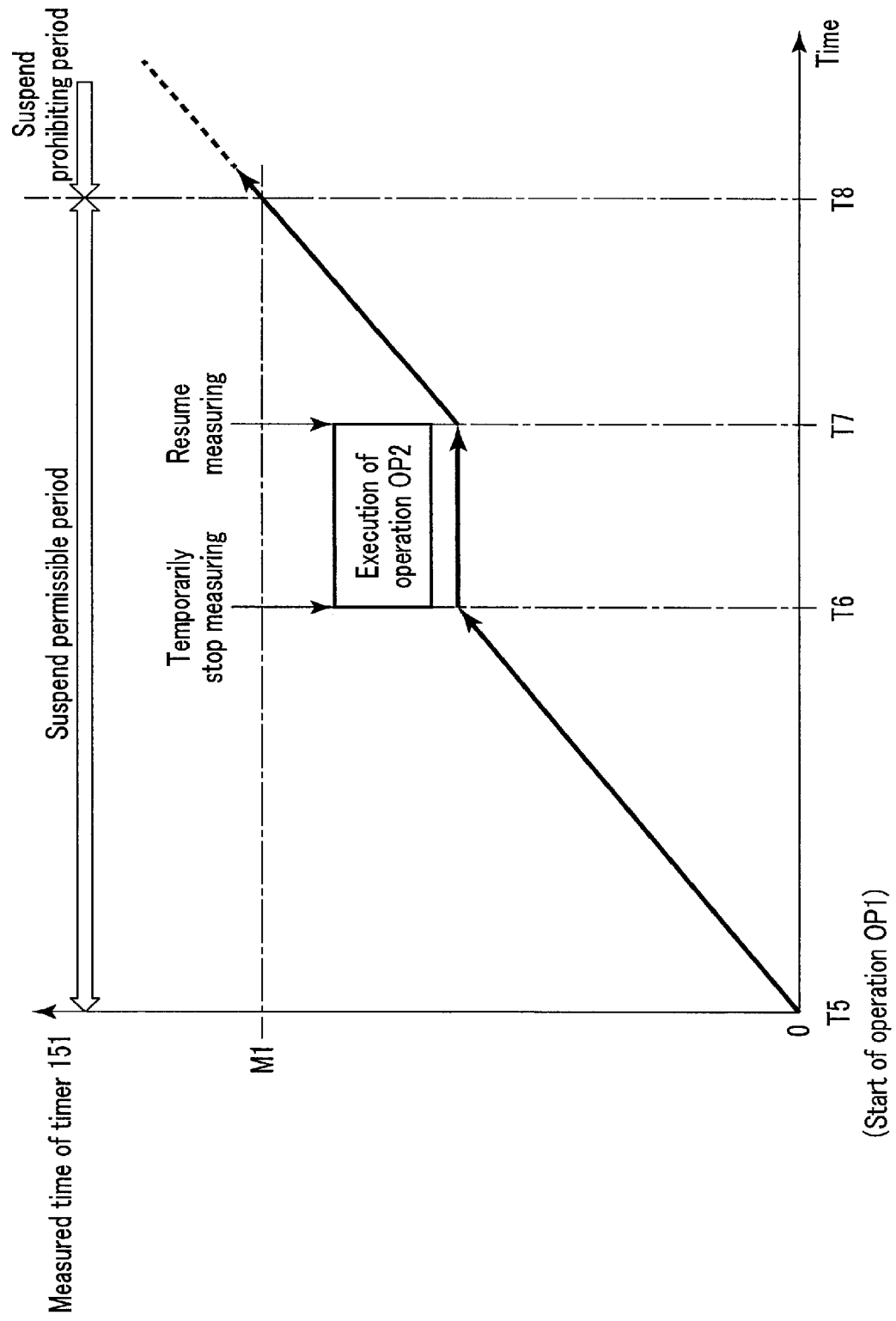
FIG. 15 is a diagram to explain a relation between a suspend operation and a measured time of a timer according to a fourth embodiment.

FIG. 15 is a diagram to explain an example of a relation between a suspend operation and a measured time of the timer in the memory system according to the fourth embodiment. FIG. 15 shows an operation of the timer 151, and corresponds to FIG. 6 showing the operation of the timer 150. In FIG. 15, the abscissa indicates time, and the ordinate indicates the measured time of the timer 151. Then, FIG. 15 shows that permission or prohibition of the suspend operation concerning an operation OP2 during the execution of the operation OP1 is changed in accordance with the measured time of the timer 151.

As shown in FIG. 15, when a chip 21 starts the operation OP1 at time T5, a NAND controller 14_0 starts the timer 151. For example, a threshold M1 is associated with the timer 151 at the time T5. For example, the NAND controller 14_0 permits the suspend operation when the measured time of the timer 151 is less than the threshold M1, and the controller prohibits the suspend operation when the measured time is not less than the threshold M1. It should be noted that the threshold M1 is beforehand stored in, for example, a register which is not shown in the drawing.

At the time T5, the measured time of the timer 151 is less than the threshold M1, and hence, a suspend permissible period is obtained. Consequently, on receiving a command to execute the operation OP2 from a host device 3, the NAND controller 14_0 issues a suspend command.

On receiving a command to execute the operation OP2 from the host device 3 at time T6, the NAND controller 14_0 and the chip 21 execute the suspend operation. Accordingly, the NAND controller 14_0 temporarily stops the measured time of the timer 151.

When the suspend operation finishes (the operation OP2 finishes and operation OP1 resumes) at time T7, the NAND controller 14_0 resumes the measuring of the timer 151. After the time T7, the suspend operation is continuously permitted until the measured time of the timer 151 reaches the threshold M1.

At time T8, the measured time of the timer 151 reaches the threshold M1. Consequently, a period after the time T8 is the suspend prohibiting period, and the NAND controller 14_0 is prohibited from issuing the suspend command even when receiving a command to execute another operation OP2 from the host device 3.

When the operation is performed as described above, the permission or prohibition of the suspend operation during the execution of the operation OP1 is switched in accordance with the measured time of the timer 151.

4.2 Flow Chart of Suspend Operation

Next, the suspend operation in the memory system according to the fourth embodiment will be described with reference to a flow chart shown in FIG. 16.

FIG. 16 corresponds to FIG. 7 described in the first embodiment, and shows steps ST10A to ST26A. Operations of the steps ST10A and ST26A are to be executed in place of the operations of the steps ST10A and ST26 in FIG. 7. It should be noted that an operation from step ST28 to step ST40 in the fourth embodiment is similar to the operation described in the first embodiment with reference to FIG. 8 and hence, description is omitted.

As shown in FIG. 16, the NAND controller 14_0 starts the timers 150 and 151 in the step ST10A. That is, the measured times of the timers 150 and 151 after the step ST10A correspond to a time elapsed after a write operation or an erase operation in the chip 21 starts.

An operation from step ST12 to step ST24 is similar to the operation from the step ST12 to the step ST24 of FIG. 7, and hence, description is omitted.

In the step ST26A, the NAND controller 14_0 resets the measured time of the timer 150 to "0", and updates a threshold to be associated with the timer 150 from a threshold N1 to a threshold N2. Additionally, in the step ST26A, the NAND controller 14_0 temporarily stops the timer 151 without resetting the measuring.

Afterward, the processing advances to the steps ST28 to ST40, thereby finishing a series of operations in one suspend operation.

When the operation is performed as described above, in the step ST10A after the step ST40, the NAND controller 14_0 starts the timer 150 from "0", and resumes the timer 151 from a value at which the measuring has been temporarily stopped in the step ST26A.

4.3 Write Operation Accompanied by Suspend Operation

Next, the write operation accompanied by the suspend operation in the memory system according to the fourth embodiment will be described with reference to FIG. 17. It should be noted that the description is omitted as to the erase operation accompanied by the suspend operation in the memory system according to the fourth embodiment, but the erase operation accompanied by the suspend operation is executable in accordance with the flow chart of FIG. 16 in the same manner as in the write operation described as follows.

FIG. 17 shows the behavior that the prohibition and permission of the suspend operation are controlled by two timers 150 and 151 during the write operation.

According to an example of FIG. 17, in the write operation, first program processing PROG1 and second program processing PROG2 are executed in this order.

As shown in FIG. 17, initially at time T50, the program processing PROG1 starts. Accordingly, the NAND controller 14_0 starts the timers 150 and 151.

In an example of FIG. 17, the measured time of the timer 150 does not reach the threshold N1 by time T51. Consequently, a period till the time T51 is a suspend prohibiting period, and the NAND controller 14_0 cannot issue the suspend command even when receiving a read command RD1 from the host device 3.

When the measured time of the timer 150 is not less than the threshold N1 at the time T51, the NAND controller 14_0 issues the suspend command and a read command in accordance with the read command RD1, to execute read processing sRD1. Accordingly, the NAND controller 14_0 temporarily stops the timer 151. When the read processing sRD1 finishes at time T52, the NAND controller 14_0 issues a resume command, to resume the write operation.

Furthermore, the NAND controller 14_0 performs status polling, thereby monitoring a progress of the program processing PROG in the chip 21 as a status, and determining a new threshold N2.

At the time T52, the write operation is resumed and the program processing PROG2 is executed. Accordingly, the NAND controller 14_0 starts the timer 150 anew and resumes the temporarily stopped timer.

The measured time of the timer 150 does not reach the threshold N2 until the time T53 is reached. Consequently, a period of the time T52 to the time T53 is the suspend prohibiting period, and the NAND controller 14_0 cannot issue the suspend command even when receiving another read command from the host device 3. On the other hand, at the time T53, the measured time of the timer 150 is not less than the threshold N2. Consequently, a period after the time T53 is the suspend permissible period.

At time T54, the measured time of the timer 151 is not less than the threshold M1. Consequently, a period after the time T54 is the suspend prohibiting period again. The suspend prohibiting period continues till time T55 at which the program processing PROG2 finishes, and hence, the NAND controller 14_0 cannot issue the suspend command after the time T54.

When the operation is performed as described above, the prohibition and permission of the suspend operation are controlled by using two timers 150 and 151.

4.4 Effect of Present Embodiment

According to the fourth embodiment, the NAND controller 14_0 prohibits the suspend, when the measured time of the timer 151 reaches the threshold M1. In consequence, an execution efficiency of the whole operation might be improved.

In addition, during the write operation, a memory controller 10 transfers write data from an internal buffer (e.g., a buffer memory 12) to the NAND package group 20, and when data writing finishes, the buffer is released. Consequently, in a final stage of the write operation, releasing the buffer before executing a new operation can improve the execution efficiency of the whole system improve, compared to delaying the release of the buffer by the suspend operation. Therefore, in the final stage of the write operation, the NAND controller 14_0 sets the threshold M1 so that the suspend operation is not executed. In consequence, deterioration of the execution efficiency due to the delay of the release of the buffer might be prevented.

5. Modified Examples

It should be noted that the respective embodiments are not limited to the above-mentioned examples, and can variously be modified. For example, in the above-mentioned respective embodiments, there has been described the case where the suspend command is issued in accordance with the read command from the host device 3, but the memory controller 10 may issue the suspend command in accordance with a read command generated by itself, irrespective of the command received from the host device 3. In this case, the priority of the read command generated by the memory controller 10 itself may be set to be low, and the priority of the read command generated in accordance with the command received from the host device 3 may be set to be high. It is presumed that the memory controller 10 generates the read command by itself during execution of, for example, garbage collection.

In addition, the following matters are applicable to the respective embodiments and respective modified examples.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory system comprising:
a nonvolatile memory; and
a controller configured to:
issue a first command to the nonvolatile memory, the first command requesting to execute a first operation; and
acquire a status of the nonvolatile memory from the nonvolatile memory, the status distinguishing between a first state of the nonvolatile memory and a second state of the nonvolatile memory, wherein,
in the first state, the nonvolatile memory executes a process for the first operation, and
in the second state, the nonvolatile memory verifies a result of the process for the first operation.

2. The memory system according to claim 1, wherein the controller is further configured to determine, on the basis of the acquired status, a timing to issue a second command to the nonvolatile memory, the second command requesting to suspend the first operation.

3. The memory system according to claim 2, wherein the controller is configured to:
determine a first threshold period as a threshold period during which the controller does not issue the second command; and
update the threshold period from the first threshold period to a second threshold period on the basis of the acquired status.

4. The memory system according to claim 3, wherein the controller is configured to update the threshold period on the basis of a length of a time for the status of the nonvolatile memory to change from the first state to the second state.

5. The memory system according to claim 1, wherein the first operation includes an erase operation to erase data stored in the nonvolatile memory,
in the first state, the nonvolatile memory executes an erase process, and
in the second state, the nonvolatile memory executes an erase-verify process.

6. The memory system according to claim 3, wherein the second threshold period is longer than the first threshold period.

7. The memory system according to claim 3, wherein the controller is further configured to:
after a time from the issuance of the first command passes the first threshold period, issue the second command to the nonvolatile memory;
issue a third command to the nonvolatile memory in which the first operation is suspended, the third command requesting to execute a second operation; and
issue a fourth command to the nonvolatile memory after the second operation finishes, the fourth command requesting to resume the suspended first operation.

8. The memory system according to claim 7, wherein the controller is further configured to, after updating the threshold period from the first threshold period to the second threshold period, until a time from the issuance of the fourth command passes the second threshold period, not issue the first command to the nonvolatile memory.

9. The memory system according to claim 7, wherein the first operation includes an erase operation to erase data stored in the nonvolatile memory, and
the second operation includes a read operation to read data stored in the nonvolatile memory.

10. The memory system according to claim 7, wherein the controller is configured to issue the first command to the nonvolatile memory, when a time to output a result of the second operation to an external device is limited.

11. A method of controlling a semiconductor memory, said method comprising:
determining a first threshold period as a threshold period during which suspending a first operation is prohibited, the first operation being executed in the semiconductor memory;
acquiring, from the semiconductor memory, a status of the semiconductor memory which is executing the first operation; and
updating the threshold period from the first threshold period to a second threshold period in accordance with the acquired status.

12. The method according to claim 11, further comprising:
issuing a first command to the semiconductor memory to start executing the first operation;

after a time in which the first operation is executed passes the first threshold period, issuing a second command to the semiconductor memory to suspend the first operation;

issuing a third command to execute a second operation to the semiconductor memory in which the first operation is suspended; and issuing a fourth command to resume the suspended first operation after the second operation finishes.

13. The method according to claim 12, wherein, after the threshold period is changed from the first threshold period to the second threshold period, the issuance of the first command is prohibited until a time in which the resumed first operation is executed passes the second threshold period.

14. The method according to claim 12, wherein the first operation includes an erase operation to erase data stored in the semiconductor memory, and the second operation includes a read operation to read data stored in the semiconductor memory.

15. The method according to claim 14, wherein the threshold period is updated from the first threshold period to the second threshold period, in accordance with a time required for the status of the semiconductor memory to change from a first state to a second state.

16. The method according to claim 15, wherein the first state includes a state of executing erase processing, and the second state includes a state of executing erase verify processing.

17. The method according to claim 12, wherein the first operation includes a write operation to write data into the semiconductor memory, and the second operation includes a read operation to read data stored in the semiconductor memory.

18. The method according to claim 17, wherein the second threshold period is larger than the first threshold period.

19. The method according to claim 12, wherein the second command is issued to the semiconductor memory when a priority of the execution of the second operation is higher than that of the prohibition of the issuance of the second command.

20. The method according to claim 19, further comprising determining that the priority of the execution of the second operation is higher than that of the prohibition of the issuance of the second command, when a time to output results of the second operation is limited.

* * * * *